(12) United States Patent
Maejima

(10) Patent No.: US 7,558,545 B2
(45) Date of Patent: Jul. 7, 2009

(54) SEMICONDUCTOR DEVICE FOR A TUNER AND DIVERSITY RECEIVER

(75) Inventor: Hideyuki Maejima, Kawasaki (JP)

(73) Assignee: Texas Instruments Incorporated, Dallas, TX (US)

( * ) Notice: Subject to any disclaimer, the term of this patent is extended or adjusted under 35 U.S.C. 154(b) by 436 days.

(21) Appl. No.: 11/427,579

(22) Filed: Jun. 29, 2006

(65) Prior Publication Data

US 2007/0021083 A1 Jan. 25, 2007

(30) Foreign Application Priority Data

Jun. 30, 2005 (JP) ............................. 2005-191278

(51) Int. Cl.
*H04B 7/08* (2006.01)
*H04B 1/18* (2006.01)
*H04B 1/06* (2006.01)

(52) U.S. Cl. .................. 455/132; 455/258; 455/183.1; 455/343.1; 455/574

(58) Field of Classification Search ................ 455/132, 455/150.1, 180.2, 183.1, 188.2, 192.1, 192.2, 455/197.1, 277.1, 334, 343.1, 574, 75, 76, 455/255, 258, 260; 331/46, 49, 52
See application file for complete search history.

(56) References Cited

U.S. PATENT DOCUMENTS

| | | | | |
|---|---|---|---|---|
| 5,159,709 A | * | 10/1992 | Hansen | 455/266 |
| 5,809,090 A | * | 9/1998 | Buternowsky et al. | 375/347 |
| 5,896,562 A | * | 4/1999 | Heinonen | 455/76 |
| 6,346,912 B1 | | 2/2002 | Reonhart et al. | |
| 6,501,342 B2 | * | 12/2002 | Marten | 331/173 |
| 6,516,422 B1 | * | 2/2003 | Doblar et al. | 713/503 |
| 6,970,045 B1 | | 11/2005 | Lichter et al. | |
| 7,027,833 B1 | * | 4/2006 | Goodman | 455/553.1 |
| 7,061,825 B2 | * | 6/2006 | Yada et al. | 365/189.07 |
| 7,102,391 B1 | * | 9/2006 | Sun et al. | 327/10 |
| 7,251,465 B2 | * | 7/2007 | Wannenmacher | 455/118 |
| 7,263,120 B2 | * | 8/2007 | Hashidate | 375/219 |
| 7,460,850 B2 | * | 12/2008 | Iwaida | 455/318 |
| 2003/0119503 A1 | * | 6/2003 | Shohara et al. | 455/434 |
| 2003/0131274 A1 | * | 7/2003 | Mizuyabu et al. | 713/324 |
| 2004/0046596 A1 | * | 3/2004 | Kaeriyama et al. | 327/165 |
| 2004/0189408 A1 | * | 9/2004 | Lum Shue Chan | 331/74 |

* cited by examiner

*Primary Examiner*—Duc M Nguyen
(74) *Attorney, Agent, or Firm*—William B. Kempler; W. James Brady; Frederick J. Telecky, Jr.

(57) ABSTRACT

A semiconductor device for a tuner generates a local oscillation signal inside or selects a local oscillation signal introduced from the outside, and controls the power consumption of the circuit used for generating the local oscillation signal. The diversity receiver constituted using the semiconductor device has semiconductor device 1 selected to generate a local oscillation signal inside and semiconductor device 2 selected to introduce a local oscillation signal from the outside. The local oscillation signal of the semiconductor device 2 is driven by the local oscillation signal of the semiconductor device 1. Consequently, any unnecessary power consumption of the circuit generating the local oscillation signal of semiconductor device 2 can be reduced. In addition, since they are the same type of semiconductor device, the uniformity of the operating characteristics of the diversity receiver can be improved.

17 Claims, 16 Drawing Sheets

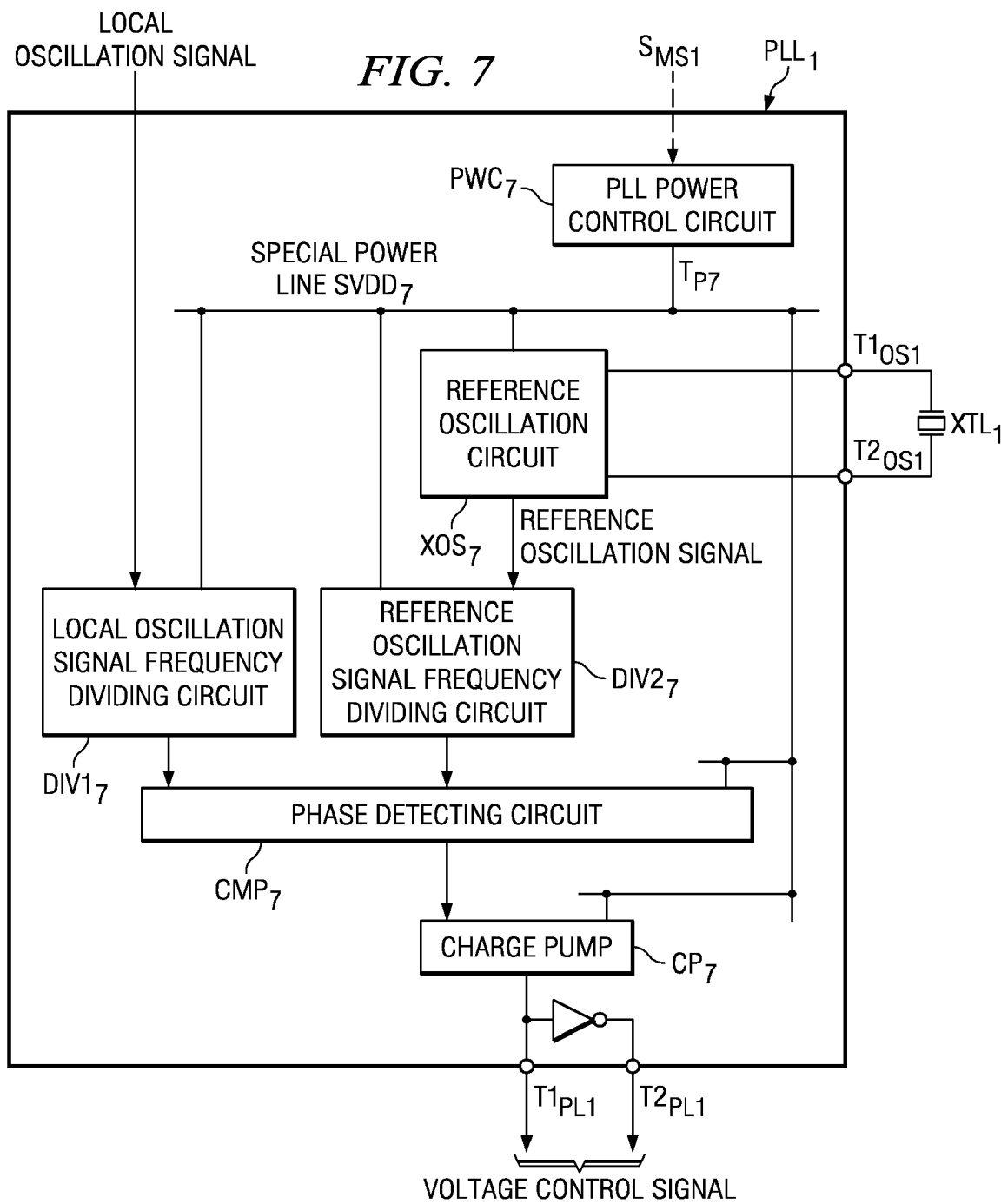

SEMICONDUCTOR DEVICE FOR A TUNER AND DIVERSITY RECEIVER

FIELD OF THE INVENTION

The present invention pertains to a semiconductor device for a tuner that includes a voltage-controlled oscillator circuit and a phase-locked loop circuit and to a diversity receiver which comprises a plurality of said semiconductor devices for tuner.

BACKGROUND OF THE INVENTION

In a conventional semiconductor device (referred to as IC hereinafter) used in a tuner that includes a voltage-controlled oscillator circuit (referred to as VCO circuit hereinafter) and a phase-locked loop circuit (referred to as PLL circuit hereinafter), the VCO circuit and the PLL circuit continuously consume power.

Japanese Kokai Patent Application No. Hei 11 [1999]-127086 discloses technology pertaining to a common UHF and VHF tuner, which avoids complicated design and high manufacturing costs and has improved broadcast receiving performance by reducing the difference of receiving sensitivity as a function of the broadcasting frequency when receiving VHF band broadcasts. Japanese Kokai Patent Application No. 2005-130279 discloses technology pertaining to an inexpensive diversity receiving tuner that can constantly receive signals from an antenna with optimal reception.

FIG. 14 shows an example of the conventional IC and tuner. As shown in FIG. 14, a conventional IC6 comprises oscillation signal input terminal TVT14, oscillation signal output terminal TVO14, voltage control signal output terminals T1PL14 and T2PL14, reference oscillation signal terminals T1OS14 and T2OS14, received signal terminal TR14, antenna tuning circuit ANT14, radio-frequency amplifier circuit RFA14, intermediate-frequency amplifier circuit AMP14, intermediate-frequency signal terminal TIF14, VCO circuit VCO14, PLL circuit PLL14, and mixer M14.

Also, as shown in FIG. 14, tuner 5 comprises IC6, LC circuit LC14 including variable-capacitance diode VC14, low-pass filter LPF14, and crystal oscillator XTL14. The oscillation signal input terminal TVI14 and oscillation signal output terminal TVO14 of IC6 are connected to LC circuit LC14. The voltage control signal output terminals T1PL14 and T2PL14 are connected to low-pass filter LPF14. The reference oscillation signal terminals T1OS14 and T2OS14 are connected to crystal oscillator XTL14.

IC6 and tuner 5 operate as follows. The radio waves of a radio broadcast or a TV broadcast are received by an antenna outside of tuner 5. The received signal is input from received signal terminal TR14 to IC6. The received signal is tuned by antenna tuning circuit ANT14 in IC6 and amplified by radio-frequency amplifier circuit RFA14. Mixer M14 converts the frequency of the amplified received signal using the local oscillation signal OSC14 generated by VCO circuit VCO14 to generate an intermediate-frequency signal. After being amplification by intermediate-frequency amplifier circuit AMP14, the intermediate-frequency signal is output from intermediate-frequency signal terminal TIF14 of IC6 and transferred to a demodulator outside of tuner 5.

VCO circuit VCO14 generates local oscillation signal OSC14 together with LC circuit LC14 via oscillation signal input terminal TVI14 and oscillation signal output terminal TVO14. Crystal oscillator XTL14 and PLL circuit PLL14 generate a reference oscillation signal via reference oscillation signal terminals T1OS14 and T2OS14. PLL circuit PLL14 also compares the phase of the reference oscillation signal and local oscillation signal OSC14 to generate a voltage control signal with respect to VCO circuit VCO14. This signal is output from voltage control signal output terminals T1PL14 and T2PL14. The output voltage control signal is converted to a DC voltage by low-pass filter LPF14 to drive variable-capacitance diode VC14 in LC circuit LC14 to control the frequency of local oscillation signal OSC14 generated by VCO circuit VCO14.

FIG. 15 shows the configuration of VCO circuit VCO14 shown in FIG. 14 and the connection to LC circuit LC14. VCO circuit VCO14 comprises the first differential section DIF115 connected to oscillation signal input terminal TVI14 and oscillation signal output terminal TIVO14 and a second differential section DIF215 that outputs local oscillation signal OSC14. The first differential section DIF115 comprises capacitor C115, voltage source circuit V15, resistors R115-R415, differential input circuit DI115 comprising transistors TR115 and TR215 that are differentially connected, and constant current circuit I115. The second differential section DIF215 comprises resistors R515 and R615, differential input circuit DI215 comprising resistors TR315 and TR415 that are differentially connected, and constant current circuit I215. Oscillation signal input terminal TVI14 and oscillation signal output terminal TVO14 are connected to LC circuit LC14 outside the IC as shown in FIG. 15.

VCO circuit VCO14 operates as follows. The first differential section DIF115 constitutes an oscillator along with LC circuit LC14. The feedback oscillation signal of LC circuit LC14 input from oscillation signal input terminal TVI14 is amplified by the first differential section DIF115 and is output from oscillation signal output terminal TV1O14.

The second differential section DIF215 constitutes a buffer circuit. The feedback oscillation signal input to the base of transistor TR215 of the first differential section DIF115 is also input as a differential input to the differential input circuit DI215 of the second differential section DIF215. The second differential section DIF215 converts the input feedback oscillation signal into a current mode signal and outputs it as local oscillation signal OSC14 to mixer M14. Local oscillation signal OSC14 is output as a differential signal from VCO circuit VCO14 to mixer M14.

In this case, the constant current circuit I115 in the first differential section DIF115 and the constant current circuit I215 in the second differential section DIF215 are in continuous operation. Thus, current flows continuously in the path from the power lines of the first differential section DIF115 and the second differential section DIF215 to ground. Therefore, VCO circuit VCO14 continuously consumes power.

FIG. 16 shows the configuration of PLL circuit PLL14 shown in FIG. 14. As shown in this figure, PLL circuit PLL14 comprises local oscillation signal frequency dividing circuit DIV116, reference oscillator circuit XOS16, reference oscillation signal frequency dividing circuit DIV216, phase detecting circuit CMP16, and charge pump circuit CP16. These circuits receive power supplied from power line VDD16 shared by mixer M14 and other circuits of an IC.

PLL circuit PLL14 operates as follows. Reference oscillator circuit XOS16 receives the oscillation signal from crystal oscillator XTL14 via reference oscillation signal terminals T1OS14 and T2OS14 and generates a reference oscillation signal. The frequency of the reference oscillation signal is divided by reference oscillation signal frequency dividing circuit DIV216, and the signal is then input to phase detecting circuit CMP16. The frequency of local oscillation signal OSC14 generated by VCO circuit VCO14 is divided by local oscillation signal frequency dividing circuit DIV116, and the signal is then input to phase detecting circuit CMP16. Phase detecting circuit CMP16 compares the phase of the two frequency-divided oscillation signals and outputs a phase detecting signal. Charge pump circuit CP16 generates a voltage control signal corresponding to the phase difference from the phase detecting signal. The voltage control signal is output to voltage control signal output terminals T1PL14 and T2PL14.

Power is continuously supplied to the power line VDD16 of local oscillation signal frequency dividing circuit DIV116, reference oscillator circuit XOS16, reference oscillation signal frequency dividing circuit DIV216, phase detecting circuit CMP16, and charge pump circuit CP16. Consequently, these circuits continuously consume power.

The configuration using two IC6 is well known in conventional diversity receivers. In this type of diversity receiver, local oscillation signals having the same frequency are generated by the VCO circuit and PLL circuit of the respective IC6.

FIG. 17 shows a conventional diversity receiver constituted using two IC6. As shown in this figure, diversity receiver 300 comprises antennas A117 and A217, two tuners 5 (5117 and 5217), demodulators DM117 and DM217, and comparator DCM17 that selects one of the two demodulated signals.

Also, as shown in FIG. 17, each tuner 5 has one IC6 (6117 or 6217), LC circuit LC14 including a variable-capacitance diode VC14, one low-pass filter LPF14, and one crystal oscillator XTL14.

Diversity receiver 300 operates as follows. Antennas A117 and A217 receive the same broadcast signal. IC6117 converts the frequency of the signal received from antenna A117. In other words, the signal received by antenna A117 is input to IC6117 at received signal terminal TR14. After being tuned by antenna tuning circuit ANT14 and amplified by radio-frequency amplifier circuit RFA14, the received signal is input to mixer M14. The VCO circuit VCO14 and PLL circuit PLL14 of IC6117 and the LC circuit LC14 of tuner 5117 generate local oscillation signal OSC117. Mixer M14 converts the frequency of the received signal using local oscillation signal OSC117 to generate an intermediate-frequency signal. The intermediate-frequency signal is amplified by intermediate-frequency amplifier circuit AMP14, output from intermediate-frequency signal terminal TIF14 of IC6117, and input to demodulator DM117. The demodulated signal generated by demodulator DM117 is input to comparator DCM17.

IC6217 converts the frequency of the signal received from antenna A217 in the same way. The demodulated signal generated by demodulator DM217 is input to comparator DCM17.

Since the receiving conditions vary as a function of the orientation of the antennas, there is qualitative difference between the demodulated signal generated by demodulator DM117 from the signal received from antenna A117 and the demodulated signal generated by demodulator DM217 from the signal received from antenna A217. Comparator DCM17 compares the two demodulated signals and selects the demodulated signal obtained from the received signal with the better reception state and outputs that signal from the diversity receiver.

In this case, local oscillation signals OSC117 and OSC217 having the same frequency are generated by the VCO circuit and PLL circuit of the respective IC6 and are used in frequency conversion of the received signal. There is another configuration of diversity receiver using two types of ICs, that is, IC6 and a mixer unit IC having no VCO circuit or PLL circuit.

FIG. 18 shows the diversity receiver constituted by using two types of ICs. As shown in FIG. 18, diversity receiver 400 comprises antennas A118 and A218, tuner 5118 using IC6, mixer unit IC518, demodulators DM118 and DM218, and mixer DCM18 that selects one of two demodulated signals.

Tuner 5118 comprises one IC6 6118, LC circuit LC14 including a variable-capacitance diode VC14, one low-pass filter LPF14, and one crystal oscillator XTL14.

As shown in FIG. 18, mixer unit IC518 comprises received signal terminal TR18, antenna tuning circuit ANT18, radio-frequency amplifier circuit RFA18, intermediate-frequency amplifier circuit AMP18, intermediate-frequency signal terminal TIF18, and mixer M18. It has no VCO circuit or PLL circuit.

Diversity receiver 400 operates as follows. Antennas A118 and A218 receive the same broadcast signal. IC6118 converts the frequency of the signal received from antenna A118. The signal received by antenna A118 is input to IC6118 at received signal terminal TR14. After being tuned by antenna tuning circuit ANT14 and amplified by radio-frequency amplifier circuit RFA14, the received signal is input to mixer M14. The VCO circuit VCO14 of IC6118 and LC circuit LC14 generate local oscillation signal OSC14. Mixer M14 converts the frequency of the received signal using the local oscillation signal OSC14 to generate an intermediate-frequency signal. The intermediate-frequency signal is amplified by intermediate-frequency amplifier circuit AMP14, output from intermediate-frequency signal terminal TIF14 of IC6118, and input to demodulator DM118. The demodulated signal generated by demodulator DM118 is input to comparator DCM18.

On the other hand, mixer unit IC518 converts the frequency of the signal received from antenna A218. The signal received by antenna A218 is input to mixer unit IC518 from received signal terminal TR18. After being tuned by antenna tuning circuit ANT18 and amplified by radio-frequency amplifier circuit RFA18, the received signal is input to mixer M18. However, since mixer unit IC518 has no VCO circuit or PLL circuit, the local oscillation signal OSC14 generated by IC6118 is supplied to mixer unit IC518 and is used in the frequency conversion performed in mixer M18. The intermediate-frequency signal obtained after the frequency conversion is amplified by intermediate-frequency amplifier circuit AMP18, output from the intermediate-frequency signal terminal TIF18 of IC518, and input to demodulator DM218. The demodulated signal generated by demodulator DM218 is input to comparator DCM18.

Like the comparator DCM17 of diversity receiver 300, the comparator DCM18 of diversity receiver 400 compares the two demodulated signals, selects the demodulated signal obtained from the received signal with the better reception state, and outputs that demodulated signal from the diversity receiver.

However, in the conventional diversity receiver shown in FIG. 17 using two IC6, whereas it would suffice if local oscillation signal were generated by one circuit, here it is generated by the VCO circuit and PLL circuit of each IC6. As a result, unnecessary power is consumed.

Also, in the diversity receiver constituted using two types of ICs as shown in FIG. 18, since the circuit pattern and IC size of IC6 and mixer unit IC518 differ, the operating characteristics of the IC also differ, making it difficult to maintain uniform operating characteristics. Also, each time there is change in semiconductor processing technology, IC6 and mixer unit IC518 must be redesigned separately, leading to an increase in development costs.

A general object of the present invention is to provide a technology that can reduce unnecessary power consumption, improve the uniformity of the operating characteristics, and reduce the development costs of the IC and the diversity receiver constituted by a plurality of said ICs.

SUMMARY OF THE INVENTION

This and other features and objects are attained, in accordance with one aspect of the present invention in which the IC comprises a mixer that converts the frequency of the received signal using a local oscillation signal, a means that generates the local oscillation signal in the semiconductor device for a tuner, a means that introduces the local oscillation signal from outside of the semiconductor device for a tuner, and a power control means that reduces the power consumption of the IC when the local oscillation signal is introduced from outside of the semiconductor device for tuner. In this way, when a local oscillation signal is introduced from outside of the IC, the power consumption of the IC can be reduced by the power control means, and the unnecessary power consumption can be avoided.

Another aspect of the present invention comprises a VCO circuit that generates a first local oscillation signal, a PLL that generates a voltage control signal for controlling the oscillation of the VCO circuit, a power control means that controls the power consumption of the VCO circuit and/or the PPL circuit, a local oscillation signal input terminal to which a second local oscillation signal is input, a local oscillation signal selecting means that selects the first or second local oscillation signal as the local oscillation signal, and a mixer that converts the frequency of the received signal with the local oscillation signal. In this way, when an external oscillation signal is present, the external oscillation signal is input to the IC as the second local oscillation signal. When the local oscillation signal selecting means selects the second local oscillation signal as the local oscillation signal used in the mixer, the frequency of the received signal can be converted without generating the first local oscillation signal. Also, in this case, the power control means can reduce the power and eliminate unnecessary power consumption by the VCO circuit and/or the PLL circuit. On the other hand, if there is no external oscillation signal, the first local oscillation signal is generated by the VCO circuit. The local oscillation signal selecting means selects the first local oscillation signal as the local oscillation signal used in the mixer. In this way, the frequency of the received signal can be converted by the IC alone.

A further aspect of the present invention is characterized by the following facts: has a selection signal input terminal and a power control signal input terminal; the local oscillation signal selecting means selects the first or second local oscillation signal as the local oscillation signal as a function of the state of the selection signal input from the selection signal input terminal; the power control means controls the power consumption of the VCO circuit and/or the PLL circuit as a function of the state of the power control signal input from the power control signal input terminal. In this way, selection of the local oscillation signal by the local oscillation signal selecting means and power control of the VCO circuit and the PLL circuit by the power control means can be performed independently via the respective terminals (selection signal input terminal and power control signal input terminal) from outside of the IC.

Yet another aspect of the present invention is characterized by the following facts: has a selection signal input terminal; the local oscillation signal selecting means selects the first or second local oscillation signal as the local oscillation signal as a function of the state of the selection signal input from the selection signal input terminal; the power control means controls the power consumption of the VCO circuit and/or the PLL circuit as a function of the state of the selection signal. In this way, the selection of the local oscillation signal by the local oscillation signal selecting means and the power control of the VCO circuit and the PLL circuit by the power control means can be performed independently via one terminal (selection signal input terminal) from outside of the IC.

A still further aspect of the present invention is characterized by the fact that in the VCO circuit has a differential input circuit, which comprises two differentially connected transistors, and a constant current circuit. Consequently, if there is an external oscillation signal, the power control means can control the power consumption of the differential input circuit and the constant current circuit to reduce the unnecessary power consumption of the VCO circuit.

A sixth aspect of the present invention is characterized by the fact that the power control means includes a circuit that controls the operation and stopping of the constant current circuit in the VCO circuit. Consequently, if there is an external local oscillation signal, the power control means can reduce the unnecessary power consumption of the VCO circuit by stopping the operation of the constant current circuit.

A seventh aspect of the present invention is characterized by the following facts: the PLL circuit comprises a first frequency dividing circuit that divides the frequency of the first local oscillation signal, a reference oscillator circuit that generates a reference oscillation signal, a second frequency dividing circuit that divides the frequency of the reference oscillator circuit, a phase detecting circuit that compares the phase of the output signals of the first and second frequency dividing signals, and a charge pump circuit that generates the voltage control signal for the VCO circuit from the output signal of the a phase detecting circuit. Consequently, if there is an external oscillation signal, the power control means can control the power consumption of the first frequency dividing circuit, the reference oscillator circuit, the second frequency dividing circuit, and the phase detecting circuit to reduce the unnecessary power consumption in the PLL circuit.

An eight aspect of the present invention is characterized by the fact that the power control means includes a power line, which is connected to the first frequency dividing circuit of the PLL circuit and the reference oscillator circuit as well as the second frequency dividing circuit, the phase detecting circuit and the charge pump circuit, and a circuit that controls the operation and stopping of the power supply to the power line. Consequently, if there is an external local oscillation signal, the power control means can control the power consumption of the first frequency dividing circuit, the reference oscillator circuit, the second frequency dividing circuit, and the phase detecting circuit to reduce the unnecessary power consumption by the PLL circuit.

A ninth aspect of the present invention is characterized by the fact that there is a local oscillation output terminal that outputs the first local oscillation signal. In this way, the IC generating the first local oscillation signal can supply the first local oscillation signal as an external oscillation signal from the local oscillation output terminal to the other IC.

A tenth aspect of the present invention is characterized in that it comprises a selection signal terminal to which a selection signal is input, an oscillation signal terminal to which an oscillation signal is input, a VCO circuit that oscillates as a function of the oscillation signal to generate a local oscillation signal when the selection signal is in a first state and stops oscillating and bypasses the oscillation signal as the local oscillation signal when the selection signal is in the second state, a PLL circuit that generates a voltage control signal for controlling the oscillation of the VCO circuit when the selection signal is in the first state and stops the generation of the voltage control signals when the selection signal is in the second state, a power control means that controls the power consumption of the VCO circuit and/or the PLL circuit as a function of the state of the selection signal, and a mixer that converts the frequency of the received signal using the local oscillation signal output from the VCO circuit. Consequently, the local oscillation signal used for frequency conversion performed in the mixer can be obtained with the selection signal in either state by using only one terminal (the oscillation signal terminal) of the IC. Also, the method of generating the local oscillation signal can be controlled by one signal (the selection signal) from outside of the IC. In addition, when the selection signal is in the second state, the power control means controls the power consumption of the VCO circuit and/or the PLL circuit to reduce the unnecessary power consumption of these circuits.

An eleventh aspect of the present invention is characterized by the fact that in the configuration of said 10, the VCO circuit comprises a differential input circuit, which includes two differentially connected transistors and a constant current circuit. Consequently, when the selection signal is in the second state, the power control means can control the power consumption of the constant current circuit and the differential input circuit to reduce the unnecessary power consumption by the VCO circuit.

A twelfth aspect of the present invention is characterized by the fact that the power control means includes a circuit that controls the operation and stopping of the constant current circuit in the VCO circuit. Consequently, when the selection signal is in the second state, the power control means can stop the operation of the constant current circuit to reduce the unnecessary power consumption by the VCO circuit.

A thirteenth aspect of the present invention is characterized by the fact that the PLL circuit comprises a first frequency dividing circuit that divides the frequency of the first local oscillation signal, a reference oscillator circuit that generates a reference oscillation signal, a second frequency dividing circuit that divides the frequency of the reference oscillator circuit, a phase detecting circuit that compares the phase of the output signals of the first and second frequency dividing signals, and a charge pump circuit that generates the voltage control signal for the VCO circuit from the output signal of the phase detecting circuit. Consequently, when the selection signal is in the second state, the power control means can control the power consumption of the first frequency dividing circuit, the reference oscillator circuit, the second frequency dividing circuit, the phase detecting circuit, and the charge pump circuit to reduce the unnecessary power consumption by the PLL circuit.

A fourteenth aspect of the present invention is characterized by the fact that the power control means includes a power line connected to the first frequency dividing circuit of the PLL circuit and the reference oscillator circuit, as well as the second frequency dividing circuit, the phase detecting circuit and the charge pump circuit, and a circuit that controls the operation and stopping of the power supply to the power line. Consequently, when the selection signal is in the second state, the power control means can reduce the unnecessary power consumption in the PLL circuit by stopping the power supply to the first frequency dividing circuit, the reference oscillator circuit, the second frequency dividing circuit, the phase detecting circuit, and the charge pump circuit through the power line.

A fifteenth aspect of the present invention is a diversity receiving device characterized by the following facts: it comprises a plurality of semiconductor devices at least one of said semiconductor devices for a first tuner generates the aforemenioned local oscillation signal inside said semiconductor device for a first tuner; another said semiconductor device for a second tuner introduces the local oscillation signal from outside of said semiconductor device for a second tuner. Consequently, the power consumption of the semiconductor device for the second tuner that introduces the local oscillation signal from outside of semiconductor device for the second tuner can be reduced to cut the unnecessary power consumption. Also, since a plurality of ICs of the same type can be used to constitute the diversity receiving device, the uniformity of the operating characteristics can be improved.

A sixteenth aspect of the present invention is a diversity receiving device characterized by the following facts: it has at least one IC1 that selects a first oscillation signal as the local oscillation signal and at least one IC2 that selects a second oscillation signal as the local oscillation signal; the local oscillation signal input terminal of said IC2 is driven by the local oscillation signal of said IC1. Consequently, IC2 can use the local oscillation signal generated by IC1 for the frequency conversion operation performed by the mixer. Also, the unnecessary power consumption of the VCO circuit and/or PLL circuit of IC2 can be reduced by the power control means. Also, since a plurality of ICs of the same type can be used to constitute the diversity receiving device, the uniformity of the operating characteristics of the diversity receiving device can be improved.

A seventeenth aspect of the present invention is a diversity receiving device characterized by the fact that it comprises a plurality of ICs and the local oscillation signal input terminal of each of said ICs is connected to the local oscillation output terminal of another IC. Consequently, the connections for generating and supplying the local oscillation signal between the plurality of ICs that constitute the diversity receiving device can be switched freely. For example, there is an IC in which the local oscillation signal selecting means selects the first local oscillation signal. If a problem occurs in the VCO circuit or PLL circuit of that IC, the local oscillation signal selecting means of that IC can select the second local oscillation signal. That IC can receive the local oscillation signal from another IC whose local oscillation signal selecting means selects the first local oscillation signal so that the frequency conversion operation in the mixer can be continued. Consequently, IC2 can use the local oscillation signal generated by IC1 in the frequency conversion operation performed in the mixer. Also, the unnecessary power consumption of the VCO circuit and/or PLL circuit of IC2 can be reduced by the power control means. Also, since a plurality of ICs of the same type can be used to constitute the diversity receiving device, the uniformity of the operating characteristics of the diversity receiving device can be improved.

Here, the "power control means" controls the power consumption of a targeted circuit. It not only includes a means that increases or reduces power consumption by activating or stopping the operation of the targeted circuit and a means that increases or reduces power consumption by supplying or cutting off the power of the targeted circuit, but also includes a means that increases or reduces power consumption by combining or separating the current paths between power supply and ground and a means that increases or reduces power consumption by raising or lowering the driving voltage of the targeted circuit, and other methods.

"The local oscillation signal selecting means" selects one of two local oscillation signals. It not only includes a means that selects one local oscillation signal as a function of the state of the signal input from outside of the IC, but also includes a means that selects one local oscillation signal as a function of the software executed inside the IC and other methods.

"Received signals" include, but are not limited to, the signals from cellular telephones, wireless LANs, and other wireless communication signals received by antennas, in addition to the signals of radio broadcasts or video broadcasts received by antennas.

"ICs" include units containing demodulators in the IC besides units without demodulator in the IC.

"Constant current circuits" include, but are not limited to, other current source circuits besides those containing the current-mirror constant current circuits and Wilson constant current circuits.

"Circuits" include circuits assembled with CMOS transistors and other circuits besides those assembled with bipolar transistors.

BRIEF DESCRIPTION OF THE DRAWINGS

FIG. 7 shows an example of the configuration of the PLL circuit in the IC shown in FIG. 1;

REFERENCE NUMERALS AND SYMBOLS AS SHOWN IN THE DRAWINGS

Figure 1:
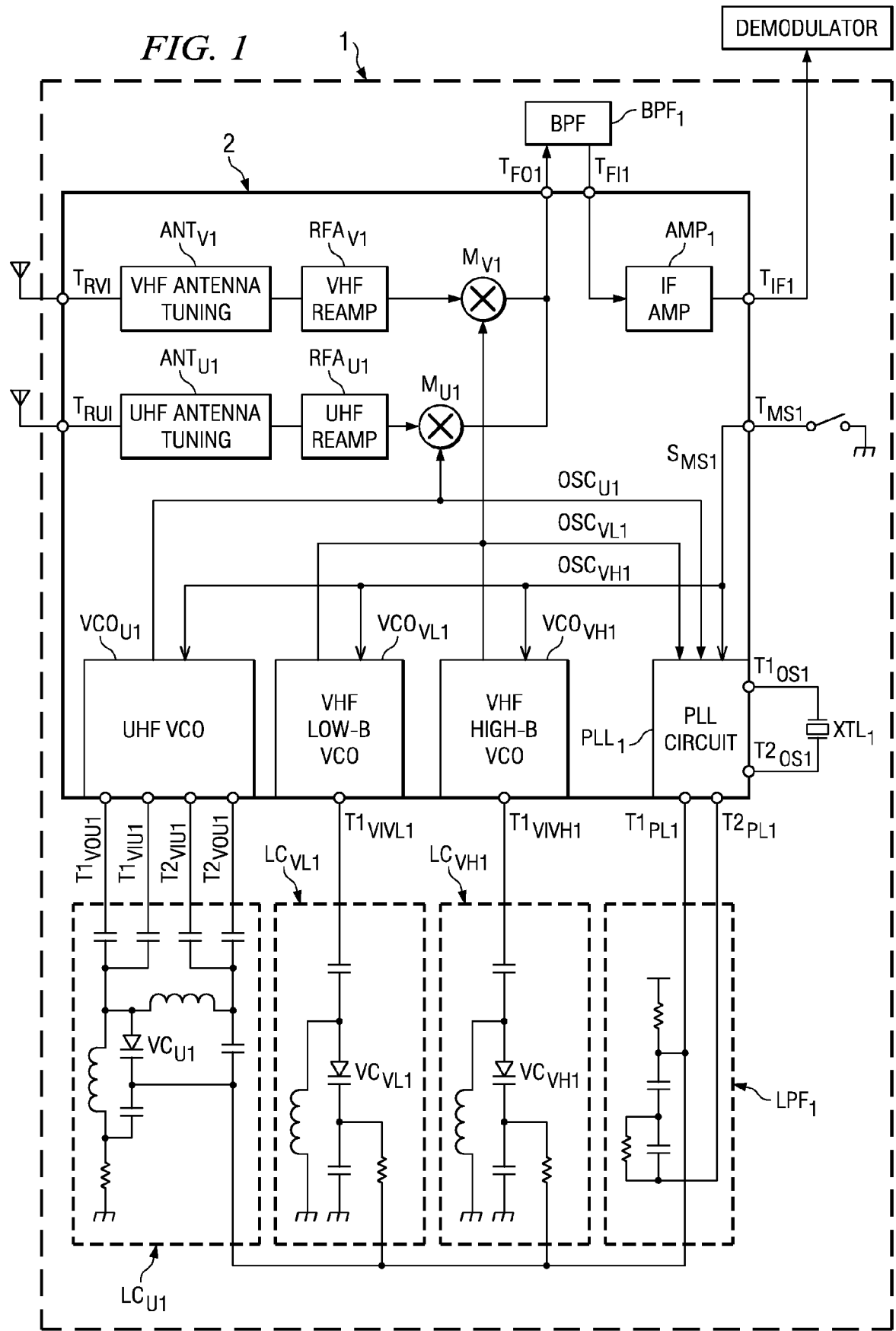
FIG. 1 shows an example of the configuration of the IC and tuner disclosed in the present invention.

In the figures, 100, 200, 300, 400 represent a diversity receiver, a 1, 3, 5, 5117, 5217, 5118: tuner, a 2, 219, 229, 4, 4113, 4213, 6, 6117, 6217, 6118 IC, a 518 mixer unit IC, A an antenna, DM a demodulator, DCM a comparator, OSC* a local oscillation signal, BUF* a buffer, C* a capacitor, VC* a variable-capacitance diode, LC* an LC circuit, LPF a low-pass filter, XTL a crystal oscillator, TR* a receiving terminal, TIF an intermediate-frequency signal terminal, TFO an intermediate-frequency filter output terminal, TFI an intermediate-frequency filter input terminal, TEOSO an external local oscillation signal output terminal, TEOSI an external local oscillation signal input terminal, TMS a master/slave selection terminal, TMU a multiplexer control terminal, T1VI* a first oscillation signal input terminal of VCO circuit, T2VI* a second oscillation signal input terminal of VCO circuit, T1VO* a first oscillation signal output terminal of VCO circuit, T2VO* a second oscillation signal output terminal of VCO circuit, TPL a voltage control signal output terminal of PLL circuit, TOS a reference oscillation signal terminal of PLL circuit, ANT an antenna tuning circuit, RFA a radio-frequency amplifier circuit, AMP an intermediate-frequency amplifier circuit, VCO* a VCO circuit, OSC* a local oscillation signal, OSCEX an external local oscillation signal, OSCIN an internal local oscillation signal, BU a buffer circuit, MU a multiplexer, M** a mixer, SMS a master/slave selection signal, SMU a multiplexer control signal, DIF1* a first differential section in VCO circuit, DIF2* a second differential section in VCO circuit, DI1* a differential input circuit in the first differential section, DI2* a differential input circuit in the second differential section, I1* a constant current circuit in the first differential section, I2* a constant current circuit in the second differential section, I2EX a constant current circuit in the second differential section, I2IN a constant current circuit in the second differential section, SW* a switch in constant current circuit, SWEX a switch in constant current circuit, SWIN a switch in constant current circuit, V* a low voltage source of VCO circuit, PLL: PLL circuit, DIV1 a local oscillation signal frequency dividing circuit DIV2 a reference oscillation signal frequency dividing circuit, XOS a reference oscillator circuit, CMP a phase detecting circuit, CP a charge pump circuit, TR a transistor element, R resistor, * represents U or VL or VH, which means UHF band, VHF low band, VHF high band, respectively, ** represents U or V, which means UHF broadcast, VHF broadcast, respectively. The character attached to reference symbol means the number of figure in which the reference number is shown.

DESCRIPTION OF THE EMBODIMENTS

As described above, for the IC comprising the mixer, VCO circuit, and PLL circuit disclosed in the present invention and the diversity receiver constituted using a plurality of said ICs, while the development cost can be kept low, the uniformity of the operating characteristics can be improved, and any unnecessary power consumption can be reduced.

In the following, an embodiment of the present invention will be explained based on FIGS. 1-9. FIG. 1 shows the configuration of the IC and tuner disclosed in an embodiment of the present invention. Said IC and tuner receive broadcasts in the low VHF band, high VHF band and UHF band.

As shown in FIG. 1, IC2 disclosed in an embodiment of the present invention comprises UHF received signal terminal TRU1 and VHF received signal terminal TRV1, UHF antenna tuning circuit ANTU1 and VHF antenna tuning circuit ANTV1, UHF radio-frequency amplifier circuit RFAU1 and VHF radio-frequency amplifier circuit RFAV1, intermediate-frequency filter output terminal TFO1 and intermediate-frequency filter input terminal TFI1, intermediate-frequency amplifier circuit AMP1, intermediate-frequency signal terminal TIF1, UHF band oscillation signal input terminals T1VIU1 and T2VIU1, UHF band oscillation signal output terminals T1VOU1 and T2VOU1, UHF band VCO circuit VCOU1, VHF low-band oscillation signal input terminal T1VIVL1, VHF low-band VCO circuit VCOVL1, VHF high-band oscillation signal input terminal 1VIVH1, VHF high-band VCO circuit VCOVH1, voltage control signal output terminals T1PL1 and T2PL1, reference oscillation signal terminals T1OS1 and T2OS1, PLL circuit PLL1, UHF band mixer MU1 and VHF band mixer MV1, and master/slave selection terminal TMS1.

Also, as shown in FIG. 1, tuner 1 comprises IC2, bandpass filter BPF1, UHF band LC circuit LCU1 including variable-capacitance diode VCU1, VHF low-band LC circuit LCVL1 including variable-capacitance diode VCVL1 and VHF high-band LC circuit LCVH1 including variable-capacitance diode VCVH1, low-pass filter LPF1, and crystal oscillator XTL1. As shown in FIG. 1, the UHF band oscillation signal input terminals T1VIU1 and T2VIU1 as well as UHF band oscillation signal output terminals T1VOU1 and T2VOU1 of IC2 are connected to UHF band LC circuit LCU1. VHF low-band oscillation signal input terminal T1VIVL1 is connected to the VHF low-band LC circuit LCVL1. VHF high-band oscillation signal input terminal T1VIVH1 is connected to VHF high-band LC circuit LCVH1. Also, voltage control signal output terminals T1PL1 and T2PL1 are connected to low-pass filter LPF1. Reference oscillation signal terminal T1OS1 and T2OS1 are connected to crystal oscillator XTL1.

IC2 and the tuner with the configuration operate as follows. When receiving UHF broadcasts, UHF broadcast radio waves are received by an antenna outside tuner 1. The received UHF signal is input from received UHF signal terminal TRU1 to IC2. After being tuned by UHF antenna tuning circuit ANTU1 inside IC2 and amplified by UHF radio-frequency amplifier circuit RFAU1, said received UHF signal is input to UHF band mixer MU1. UHF band mixer MU1 converts the frequency of the amplified received UHF signal using the UHF band local oscillation signal OSCU1 generated by UHF band VCO circuit VCOU1 to generate an intermediate-frequency UHF signal. Said intermediate-frequency UHF signal is output from IC2 from intermediate-frequency filter output terminal TFO1 and is filtered by bandpass filter BPF1. The filtered intermediate-frequency UHF signal is reinput to IC2 from intermediate-frequency filter input terminal TFI1. After being amplified by intermediate-frequency amplifier circuit AMP1, the filtered intermediate-frequency UHF signal is output from IC2 at the intermediate-frequency signal terminal TIF1 of IC2 and transferred to the demodulator outside tuner 1.

UHF band VCO circuit VCOU1 generates UHF band local oscillation signal OSCU1 along with UHF band LC circuit LCU1 via UHF band oscillation signal input terminals T1VIU1 and T2VIU2 as well as UHF band oscillation signal output terminals T1VOU1 and T2VOU1. On the other hand, crystal oscillator XTL1 and PLL circuit PLL1 generate a reference oscillation signal via reference oscillation signal terminals T1OS1 and T2OS1. PLL circuit PLL1 also compares the phase of the reference oscillation signal to the UHF band local oscillation signal OSCU1, generates a voltage control signal with respect to UHF band VCO circuit VCOU1, and outputs the voltage control signal from voltage control signal output terminals T1PL1 and T2PL1. The output voltage control signal is converted to a DC voltage by low-pass filter LPF1 to drive variable-capacitance diode VCU1 included in UHF band LC circuit LCU1 to control the frequency of UHF band local oscillation signal OSCU1 generated by UHF band VCO circuit VCOU1.

When receiving VHF broadcasts, the VHF broadcast radio waves are received by an antenna outside tuner 1. The received VHF signal is input from received VHF signal terminal TRV1 to IC2. After being tuned by VHF antenna tuning circuit ANTV1 inside IC2 and amplified by VHF radio-frequency amplifier circuit RFAV1, the received VHF signal is input to VHF band mixer MV1. If the frequency band of the VHF broadcast is the low-frequency band, VHF band mixer MV1 converts the frequency of the VHF low band local oscillation signal OSCVL1 generated by VHF low-band VCO circuit VCOVL1 and the amplified received VHF signal to generate an intermediate-frequency VHF signal. If the frequency band of VHF broadcast is the high-frequency band, VHF band mixer MV1 converts the frequency of the VHF high-band local oscillation signal OSCVH1 generated by VHF high band VCO circuit VCOVH1 and the amplified received VHF signal to generate an intermediate-frequency VHF signal. The intermediate-frequency VHF signal is output from IC2 at intermediate-frequency filter output terminal TFO1 and filtered by bandpass filter BPF1. The filtered intermediate-frequency VHF signal is reinput to IC2 from intermediate-frequency filter input terminal TFI1. After being amplified by intermediate-frequency amplifier circuit AMP1, the filtered VHF intermediate-frequency signal is output from the intermediate-frequency signal terminal TIF1 Of IC2 and transferred to the demodulator from tuner 1.

If the frequency band of VHF broadcast is the low-frequency band, VHF low band VCO circuit VCOVL1 generates VHF low-band local oscillation signal OSCVL1 along with VHF low band LC circuit LCVL1 via VHF low-band oscillation signal input terminal T1VTVL1. On the other hand, crystal oscillator XTL1 and PLL circuit PLL1 generate a reference oscillation signal via reference oscillation signal terminals T1OS1 and T2OS1. PLL circuit PLL1 also compares the phase of the reference oscillation signal to VHF low band local oscillation signal OSCVL1 to generate a voltage control signal with respect to VHF low band VCO circuit VCOVL1. The voltage control signal is output from voltage control signal output terminals T1PL1 and T2PL1. The output voltage control signal is converted to a DC voltage by low-pass filter LPF1 to drive variable-capacitance diode VCVL1 included in VHF band LC circuit LCVL1 to control the frequency of UHF band local oscillation signal OSCVL1 generated by VHF band VCO circuit VCOVL1.

If the frequency band of the VHF broadcast is the high-frequency band, VHF high band VCO circuit VCOVH1 generates said VHF high-band local oscillation signal OSCVH1 along with VHF high band LC circuit LCVH1. The operation of PLL circuit PLL1, etc., is the same as when the VHF low-frequency band.

Master/slave selection signal SMS1 input from master/slave selection terminal TMS1 is connected to VHF band VCO circuit VCOU1, VHF low-band VCO circuit VCOVL1, VHF high-band VCO circuit VCOVH1, and PLL circuit PLL1.

If said master/slave selection terminal TMS1 is grounded, slave mode will be selected. In slave mode, the operations of UHF band VCO circuit VCOU1 and VHF low-band VCO circuit VCOVL1 as well as VHF high-band VCO circuit VCOVH1 and PLL circuit PLL1 are stopped. Also, the power consumption of these circuits is reduced by a method that will be described below. In the IC set to slave mode, an oscillation signal is input from outside of the IC, and the frequency conversion is performed using this oscillation signal as the local oscillation signal.

If master/slave selection terminal TMS1 is open, master mode will be selected. In master mode, the operations of UHF band VCO circuit VCOU1 and VHF low-band VCO circuit VCOVL1 as well as VHF high-band VCO circuit VCOVH1 and PLL circuit PLL1 are conducted. In the IC set to master mode, the frequency conversion is performed using the local oscillation signal generated inside the IC.

Figure 2:
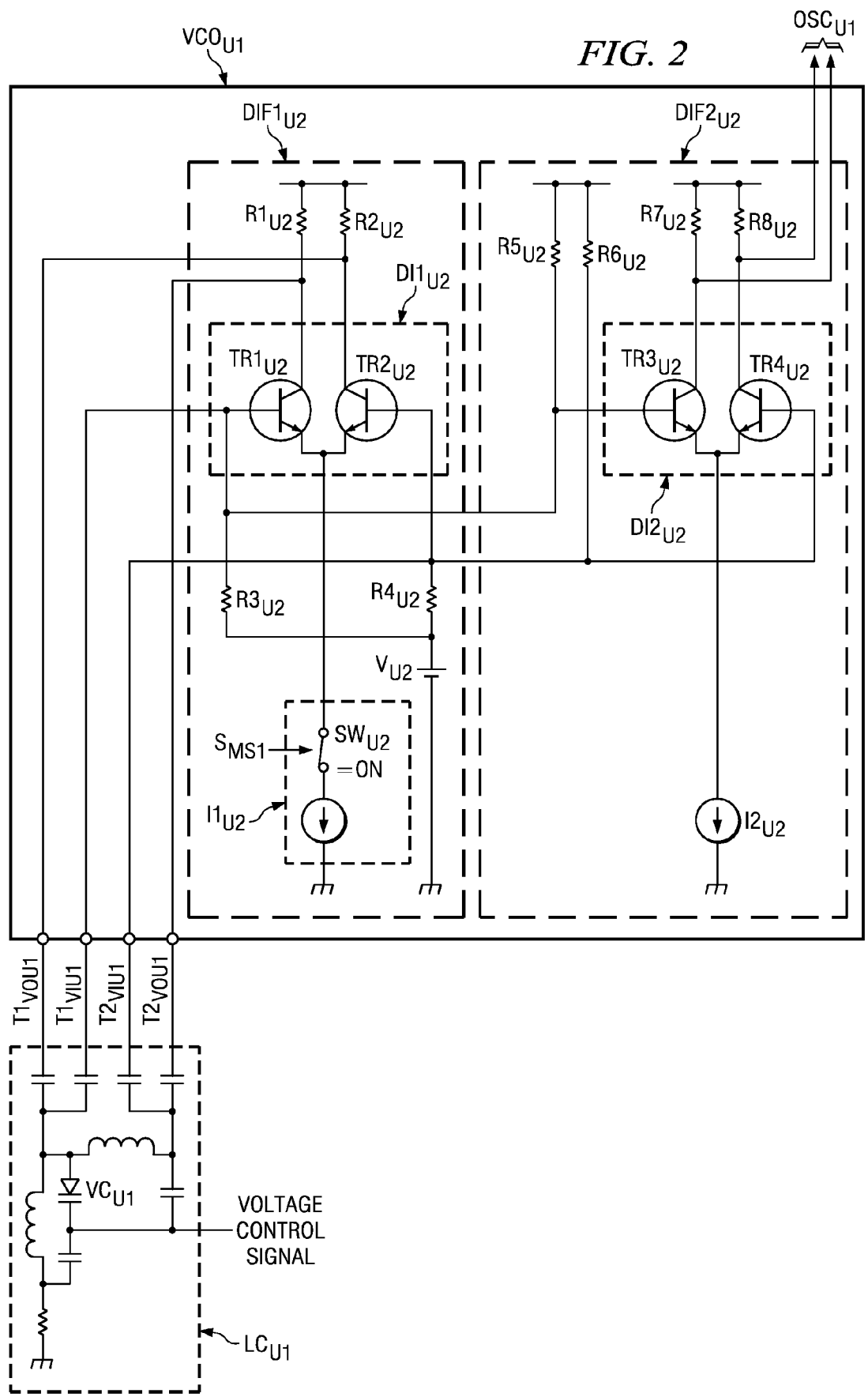
FIG. 2 shows an example of the configuration of the UHF band VCO circuit in the IC shown in FIG. 1 and its connection with the UHF band LC circuit in master mode.

FIG. 2 shows the configuration of UHF band VCO circuit VCOU1 shown in FIG. 1 and its connection to the UHF band LC circuit LCU1 in master mode. As shown in FIG. 2, UHF band VCO circuit VCOU1 comprises a first differential section DIF1U2 connected to UHF band oscillation signal input terminals T1VIU1 and T2VIU1, as well as UHF band oscillation signal output terminals T1VOU1 and T2VOU1, and a second differential section DIF2U2 that outputs local oscillation signal OSCU1. The first differential section DIF1U2 comprises a voltage source VU2, resistors R1U2-R4U2, differential input circuit DI1U1 comprising differentially connected transistors TR1U2 and TR2U2, and switch SWU2 attached to constant current circuit I1U2. The second differential section DIF2U2 comprises resistors R3U2-R6U2, differential input circuit DI2U1 comprising differentially connected transistors TR3U2 and TR4U2, and constant current circuit I2U2. UHF band oscillation signal input terminals T1VIU1 and T2VIU1 as well as UHF band oscillation signal output terminals T1VOU1 and T2VOU1 are connected to UHF band LC circuit LCU1 outside the IC as shown in FIG. 2.

UHF band VCO circuit VCOU1 with the configuration operates as follows. The first differential section DIF1U2 constitutes an oscillator together with UHF band LC circuit LCU1. The feedback oscillation signal of UHF band LC circuit LCU1 input from UHF band oscillation signal input terminals T1VIU1 and T2VIU1 is amplified by the first differential sectional DIF1U2 and is output from UHF band oscillation signal output terminals T1VOU1 and T2VOU1. The reason that four terminals are used is to have a stabilized adjustment range with respect to the UHF high-band local oscillation signal.

Switch SWU2 of constant current circuit I1U2 is controlled by said master/slave selection signal SMS1. If said master/slave selection signal SMS indicates master mode, switch SWU2 operates constant current circuit I1U2. Constant current circuit I1U2 constitutes a feedback amplifier circuit along with differential input circuit DI1U2. UHF band VCO circuit VCOU1 oscillates normally.

The second differential section DIF2U2 constitutes a buffer circuit. The feedback oscillation signal input to the bases of transistors TR1U2 and TR2U2 of the first differential section DIF1U2 is also input as a differential input to the differential input circuit DI2U2 of the second differential section DIF2U2. The second differential section DIF2U2 converts the input feedback oscillation signal to a current mode signal and outputs it as UHF band local oscillation signal OSCU1 to UHF band mixer MU1. In this case, UHF band local oscillation signal OSCU1 is output as a differential signal from UHF band VCO circuit VCOU1 to UHF band mixer MU1.

Figure 3:
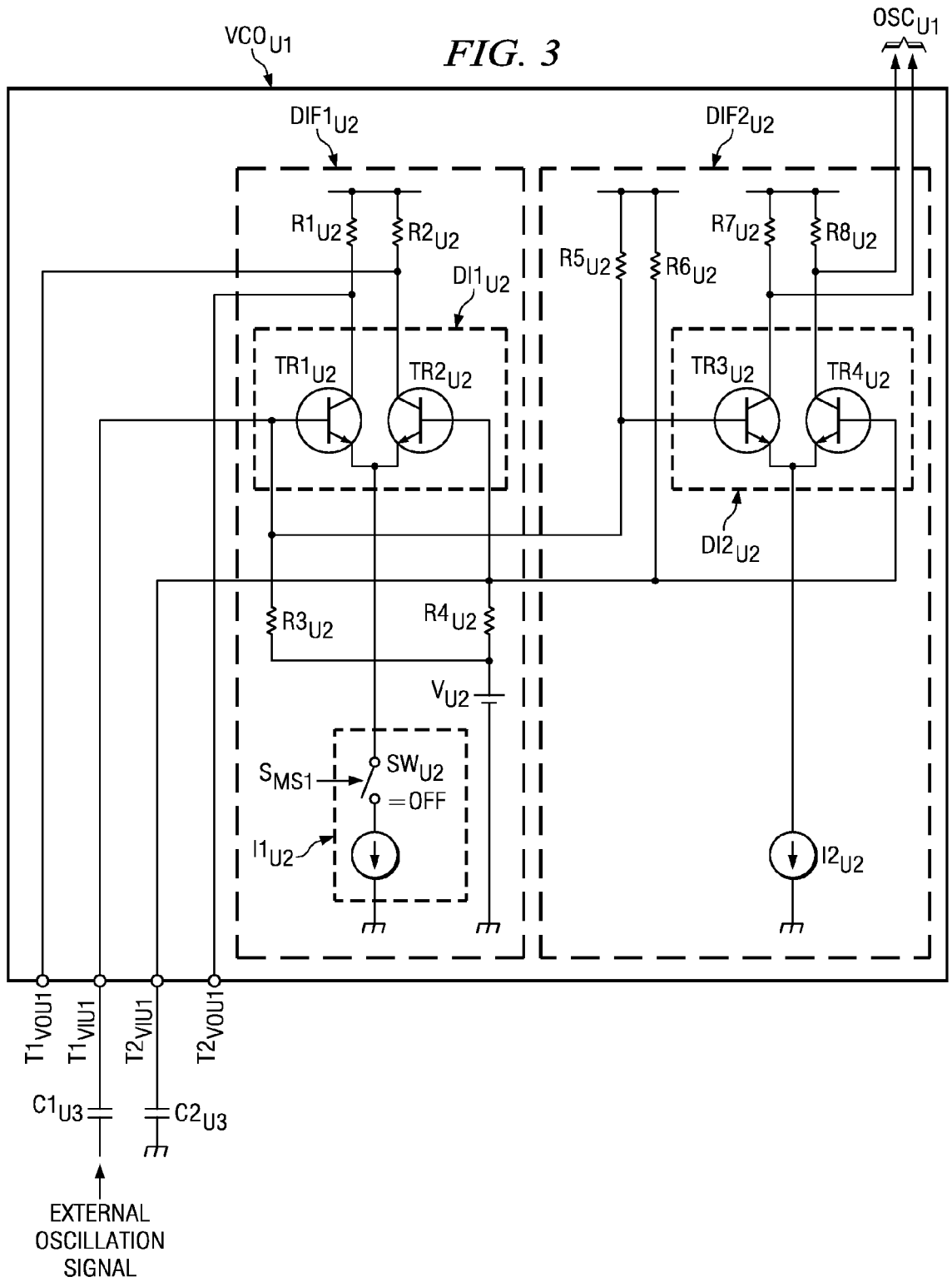
FIG. 3 shows the status of the UHF band VCO circuit in the IC shown in FIG. 1 and the connection with the UHF band LC circuit in slave mode.

FIG. 3 shows the configuration of UHF band VCO circuit VCOU1 shown in FIG. 1 and the connection with UHF band LC circuit LCU1 when set in slave mode. In slave mode, oscillation signal input terminal T1VIU1 is driven by an external oscillation signal via capacitor C1U3. Oscillation signal input terminal T2VIU1 is grounded via capacitor C2U3. Also, oscillation signal output terminals T1VOU1 and T2VOU1 are open. The first differential section DIF1U2 does not perform feedback amplification. Since the first differential section DIF1U2 does not perform feedback amplification, the external oscillation signal bypasses the first differential section DIF1U2 and is input to the second differential section DIF2U2. The second differential section DIF2U2 converts the oscillation signal input from the outside into a current mode signal as local oscillation signal OSCU1, which is then output to UHF band mixer MU1.

When said master/slave selection signal SMS indicates slave mode, switch SWU2 stops the operation of constant current circuit I1U2. In this case, the oscillation of UHF band VCO circuit VCOU1 is stopped and no current flows through transistors TR1U2 and TR2U2 of differential input circuit DI1U2. Therefore, any unnecessary power consumption in the first differential section DIF1U2 can be reduced.

Figure 4:
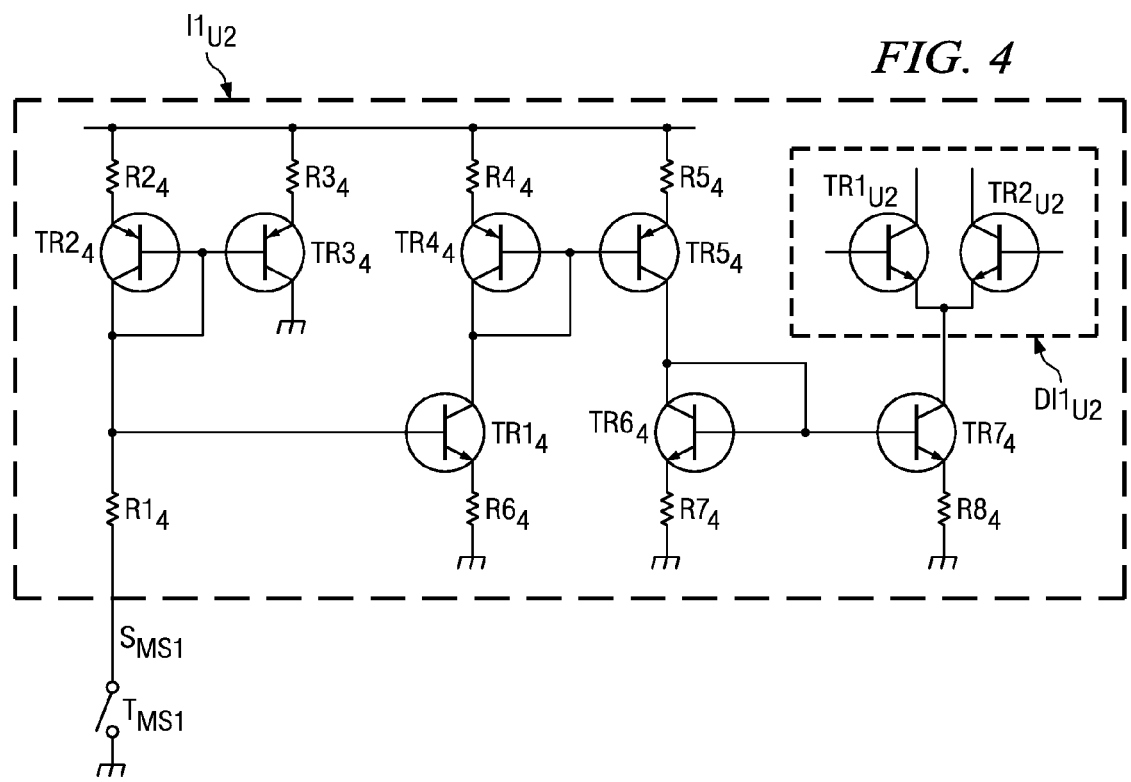
FIG. 4 shows the configuration of switch attached-constant current circuit in the UHF band VCO circuit shown in FIG. 2.

FIG. 4 shows the configuration of constant current circuit I1U2 with attached switch SWU2 shown in FIG. 2. As shown in FIG. 4, constant current circuit I1U2 with attached switch SWU2 comprises resistors R14-R84, transistor TR14 receiving master/slave selection signal SMS1 of master/slave selection terminal TMS1, transistors TR24 and TR34 that serve as a first current source, transistors TR44 and TR54 that serve as a second current source, and transistors TR64 and TR74 that constitute a current-mirror constant current circuit connected to differential input circuit DI1U2.

Said switch SWU2-attached constant current circuit I1U2 operates as follows. When master/slave selection terminal TMS1 is open, current from the collector of transistor TR24 of the first current source flows into the base of the first transistor TR14. Therefore, current flows through the collector of transistor TR14, causing an input current to flow through transistor TR44 of the second current source. The second current source amplifies the input current and sources current to the collector of the transistor TR64 of the current-mirror constant current circuit. As a result, the current-mirror constant current circuit receives input current to operate.

When master/slave connection terminal TMS1 is grounded, current from the collector of transistor TR24 of the first current source flows into the grounded master/slave selection terminal TMS1. As a result, no base or collector current flows through the first transistor TR14. Since the transistor TR44 of the second current source has no input current, the second current source does not amplify, and no current is supplied to the collector terminal of the transistor TR64 of the current-mirror constant current circuit. As a result, the current-mirror constant current circuit cannot receive input current to operate.

Figure 5:
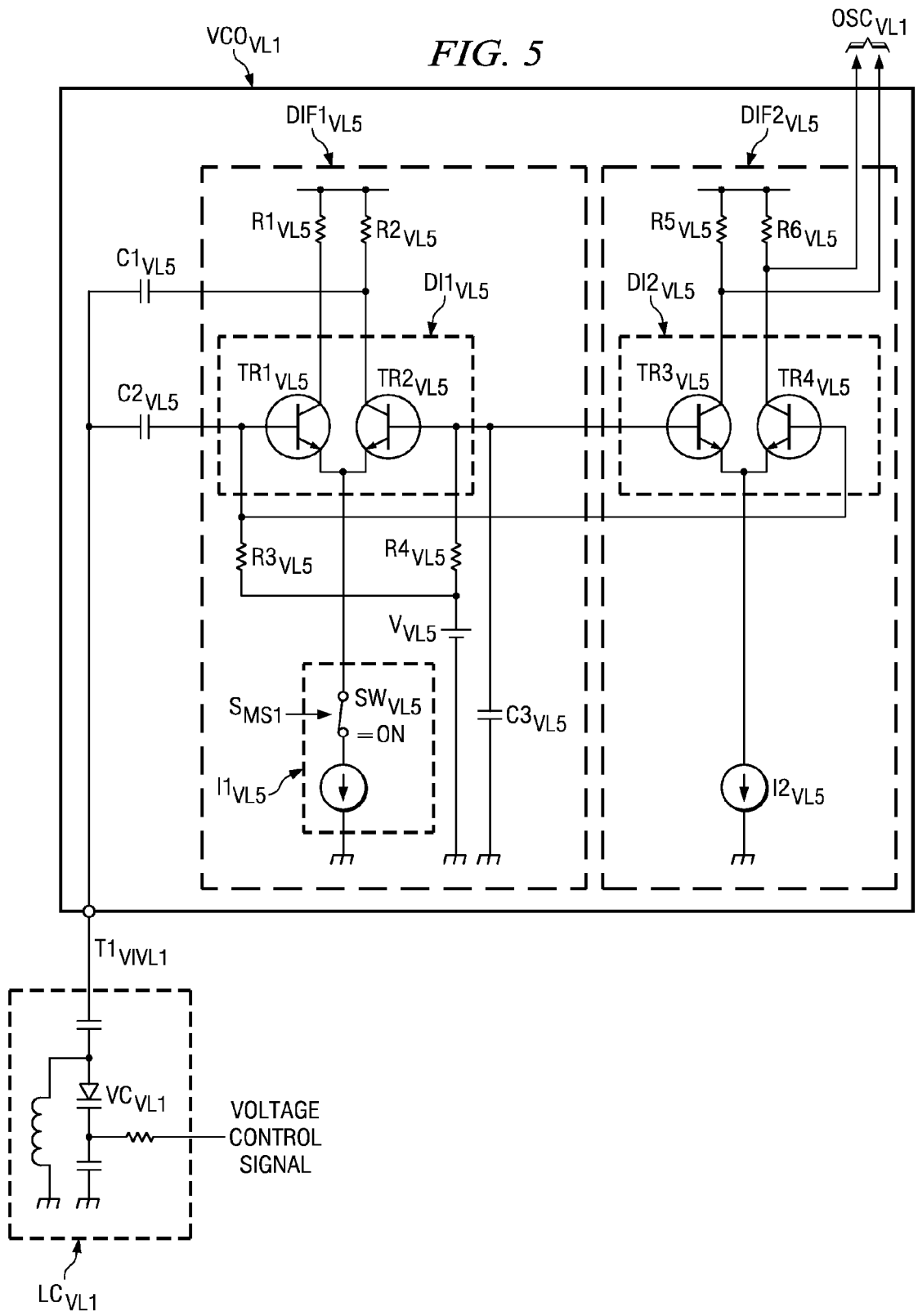
FIG. 5 shows an example of the configuration of the VHF low-band VCO circuit in the IC shown in FIG. 1 and the connection to the VHF low band LC circuit in master mode.

FIG. 5 shows the configuration of VHF low-band VCO circuit VCOVL1 shown in FIG. 1 and connection to VHF low band LC circuit LCVL1 when it is set to master mode. The configuration and operation of VHF high band LC circuit LCVH1 are the same as those of VHF low-band VCO circuit VCOVL1 except for the circuit parameters. Its explanation is therefore omitted.

As shown in FIG. 5, VHF low-band VCD circuit VCOVL1 comprises the first differential section DIF1VL5 connected to VHF low band oscillation signal input terminal T1VIVL1 and the second differential section DIF2VL5 that outputs local oscillation signal OSCVL1. The first differential section DIF1VL5 comprises voltage source VVL5, capacitors C1VL5-C3VL5, resistors R1VL5-R4VL5, differential input circuit DI1VL5 comprising differentially connected transistors TR1VL5 and TR2VL5, and switch SWVL5-attached constant current circuit I1VL5. The second differential section DIF2VL5 comprises resistors R5VL5 and R6VL5, differential input circuit DI2VL5 comprising differentially connected transistors TR3VL5 and TR4VL5, and constant current circuit I2VL5. VHF low band oscillation signal input terminal T1VIVL1 is connected to VHF low band LC circuit LCVL1 outside the IC as shown in FIG. 5.

VHF low band VCO circuit VCOVL1 with the configuration operates as follows. The first differential section DIF1VL5 constitutes an oscillator along with VHF low-band LC circuit LCVL1. The feedback oscillation signal generated by VHF low band LC circuit LCVL1 and input from oscillation signal input terminal T1VTVL1 is amplified by the first differential section DIF1VL5.

The switch SWVL5 of constant current circuit I1VL5 is controlled by said master/slave selection signal SMS1. If said master/slave selection signal SMS indicates master mode, switch SWVL5 operates constant current circuit I1VL5. Constant current circuit I1VL5 constitutes a feedback amplifier circuit along with differential input circuit DI1VL5. VHF low-band VCO circuit VCOVL1 oscillates normally.

The second differential section DIF2VL5 constitutes a buffer circuit. The feedback oscillation signal input to the base terminal of transistors TR1VL5 and TR2VL5 of the first differential section DIF1VL5 is also input as differential input to the differential input circuit DIF2VL5 of the second differential section DIF2VL5. The second differential section DIF2VL5 converts the input feedback oscillation signal into a current mode signal and outputs it as local oscillation signal OSCVL1 to VHF band mixer MV1. In this case, local oscillation signal OSCVL1 is output as a differential signal from VHF low band VCO circuit VCOVL1 to VHF band mixer MV1.

Figure 6:
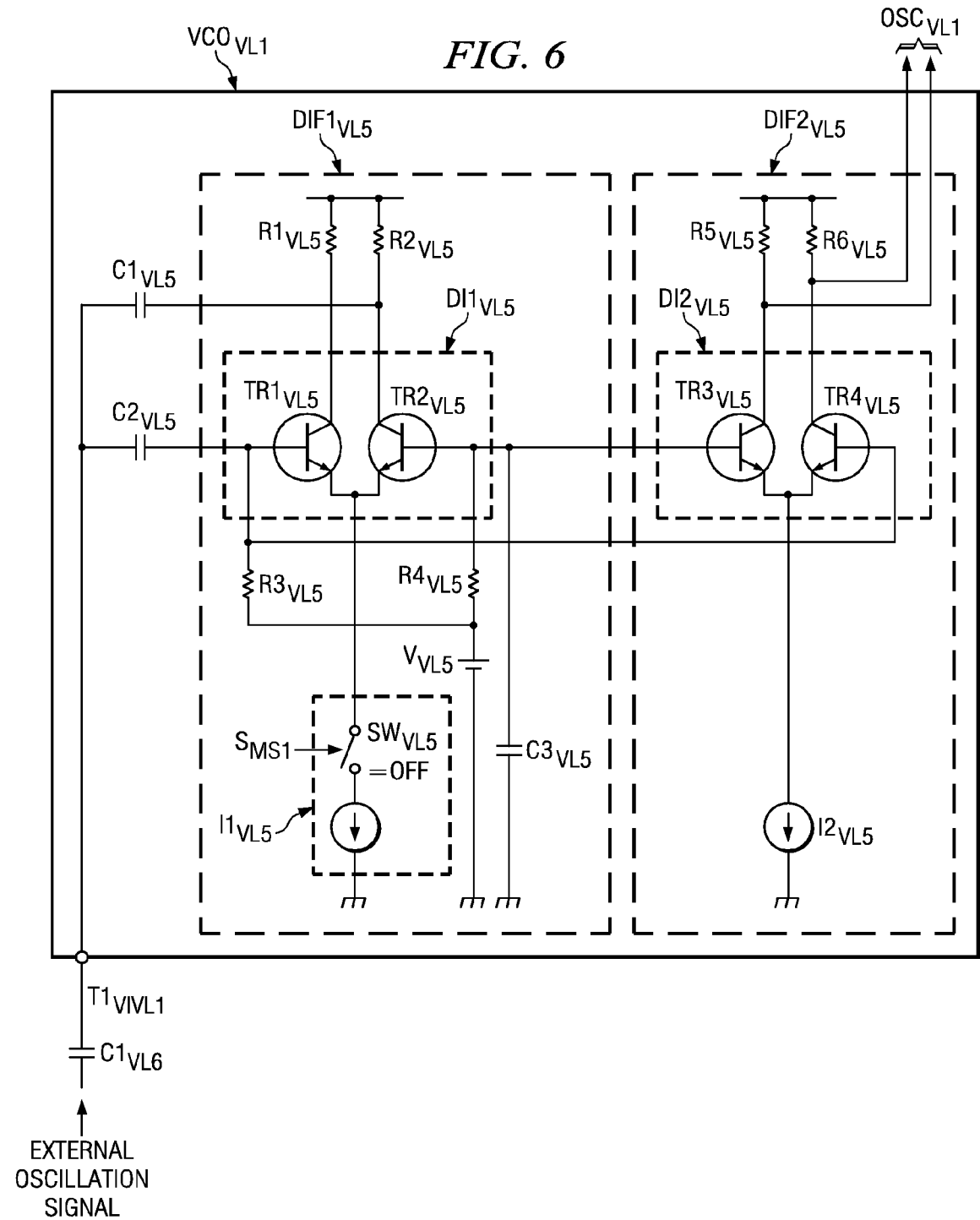
FIG. 6 shows the state of the VHF low band VCO circuit in the IC shown in FIG. 1 and the connection to the VHF low band LC circuit in slave mode.

FIG. 6 shows the configuration of VHF low band VCO circuit VCOVL1 shown in FIG. 1 and the connection to VHF low band LC circuit LCVL1 in slave mode. In slave mode, an external oscillation signal drives oscillation signal input terminal T1VIVL1 via capacitor C1VL6. Since the first differential section DIF1U2 does not perform feedback amplification, the external oscillation signal bypasses the first differential section DIF1VL5 and is input to the second differential section DIF2VL5. The second differential section DIF2VL5 converts the input external oscillation signal into a current mode signal and outputs it as local oscillation signal OSCVL1 to VHF band mixer MV1.

If said master/slave selection signal SMS indicates slave mode, switch SWVL5 stops the operation of constant current circuit I1VL5. In this case, the oscillation of VHF low band VCO circuit VCOVL1 is stopped and no current flows through transistors TR1VL5 and TR2VL5 of differential input circuit DI1VL5. Therefore, any unnecessary power consumption in the first differential section DIF1VL5 can be reduced.

The configuration of switch SWVL5-attached constant current circuit I1VL5 is the same as switch SWU2-attached constant current circuit I1U2 of UHF band VCO circuit VCOU1. Therefore, its explanation is omitted.

In master mode, the VCO circuit outside the receiving band also stops oscillating through control of the switch of the constant current circuit in the first differential section to stop the feedback amplification of the first differential section. In other words, besides being controlled by the selection of master/slave mode, the switch of the constant current circuit is also controlled by the selection of the receiving band. For example, when receiving a UHF broadcast, VHF low-band VCO circuit VCOVL1 and VHF high-band VCO circuit VCOVH1 stop oscillating even in master mode.

FIG. 7 shows the configuration of the PLL circuit PLL1 shown in FIG. 1. As shown in FIG. 7, PLL circuit PLL1 comprises local oscillation signal frequency dividing circuit DIV17, reference oscillator circuit XOS7, reference oscillation signal frequency dividing circuit DIV27, phase detecting circuit CMP7, charge pump circuit CP7, and PLL power control circuit PWC7. The power lines of these circuits are connected to a special power line SVDD7.

The PLL circuit PLL1 with the configuration operates as follows. Reference oscillator circuit XOS7 receives the oscillation signal of crystal oscillator XTL1 via reference oscillation signal terminals T1OS1 and T2OS1 and generates a reference oscillation signal. The frequency of the reference oscillation signal is divided by reference oscillation signal frequency dividing circuit DIV27, and the result is input to phase detecting circuit CMP7. On the other hand, the frequency of said UHF band local oscillation signal OSCU1 when receiving a UHF broadcast or said VHF low-band local oscillation signal OSCVL1, or VHF high-band local oscillation signal OSCVH1 when receiving a VHF broadcast, is divided by local oscillation signal frequency dividing circuit DIV17, and the result is input to phase detecting circuit CMP7. Phase detecting circuit CMP7 compares the phase of the two frequency divided oscillation signals and outputs a phase detection signal. Charge pump circuit CP7 generates a voltage control signal corresponding to the phase difference from the phase detection signal and outputs the voltage control signal to voltage control signal output terminals T1PL1 and T2PL1.

Special power line SVDD7 is driven by the power terminal TP7 of PLL power control circuit PWC7. PLL power control circuit PWC7 is controlled by said master/slave selection signal SMS1.

If said master/slave selection signal SMS1 indicates master mode, PLL power control circuit PWC7 supplies power from power terminal TP7 to special power line SVDD7. Therefore, in master mode, power is supplied to reference oscillator circuit XOS7, reference oscillation signal frequency dividing circuit DIV27, phase detecting circuit CMP7, and charge pump circuit CP7.

If said master/slave selection signal SMS1 indicates slave mode, PLL power control circuit PWC7 stops the supply of power to SVDD6. Consequently, in slave mode, the power supplied to reference oscillator circuit XOS7, reference oscillation signal frequency dividing circuit DIV27, phase detecting circuit CMP7, and charge pump circuit CP7 is stopped. Any unnecessary power consumption in PLL circuit PLL1 can be reduced.

Figure 8:
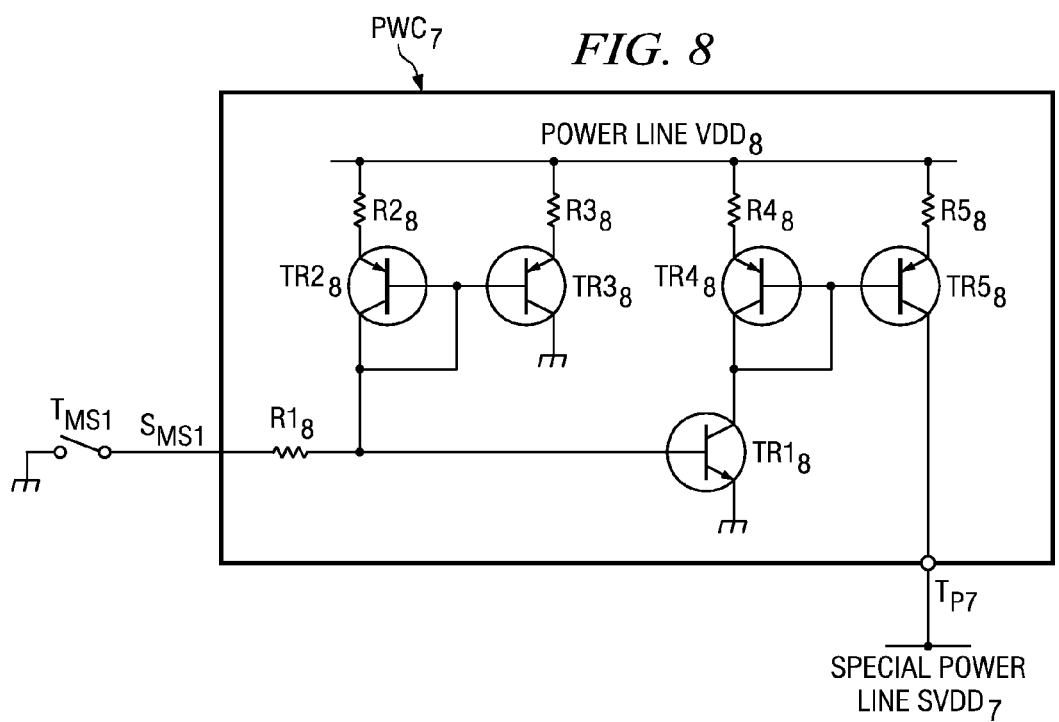
FIG. 8 shows an example of the configuration of the PLL power control circuit in the IC shown in FIG. 1.

FIG. 8 shows the configuration of PLL power control circuit PWC7 shown in FIG. 7. As shown in FIG. 8, PLL power control circuit PWC7 comprises resistors R18-R58, the first transistor TR18 that receives said master/slave selection signal SMS1 input from master/slave selection terminal TMS1, transistors TR28 and TR38 that constitute the first current source, and an amplifier circuit constituted with differentially connected transistors TR48 and TR58. Power is supplied to these circuits from power line VDD8 that supplies power constantly. Power terminal TP7 is connected to the collector terminal of transistor TR58.

The PLL power control circuit PWC7 with the configuration operates as follows. If master/slave selection terminal TMS1 is open, current from the collector of transistor TR28 of the first current source flows into the base of the first transistor TR18. As a result, current flows into the collector current of the first transistor TR18, and the transistor TR38 of in the amplifier circuit receives an input current. Therefore, the amplifier circuit amplifies the input current. The collector current of transistor TR58 is supplied from power terminal TP6 to special power line SVDD6.

When master/slave selection terminal TMS1 is grounded, the collector current of the transistor TR28 of the first current source flows into the grounded master/slave selection terminal TMS1. As a result, no base or collector current flows in the first transistor TR18. Since the transistor TR38 of the amplifier circuit cannot receive input current, the amplifier circuit does not amplify. As a result, of the transistor TR58 has no collector current, the power supplied from power terminal TP7 to special power line SVDD6 is stopped.

Figure 9:
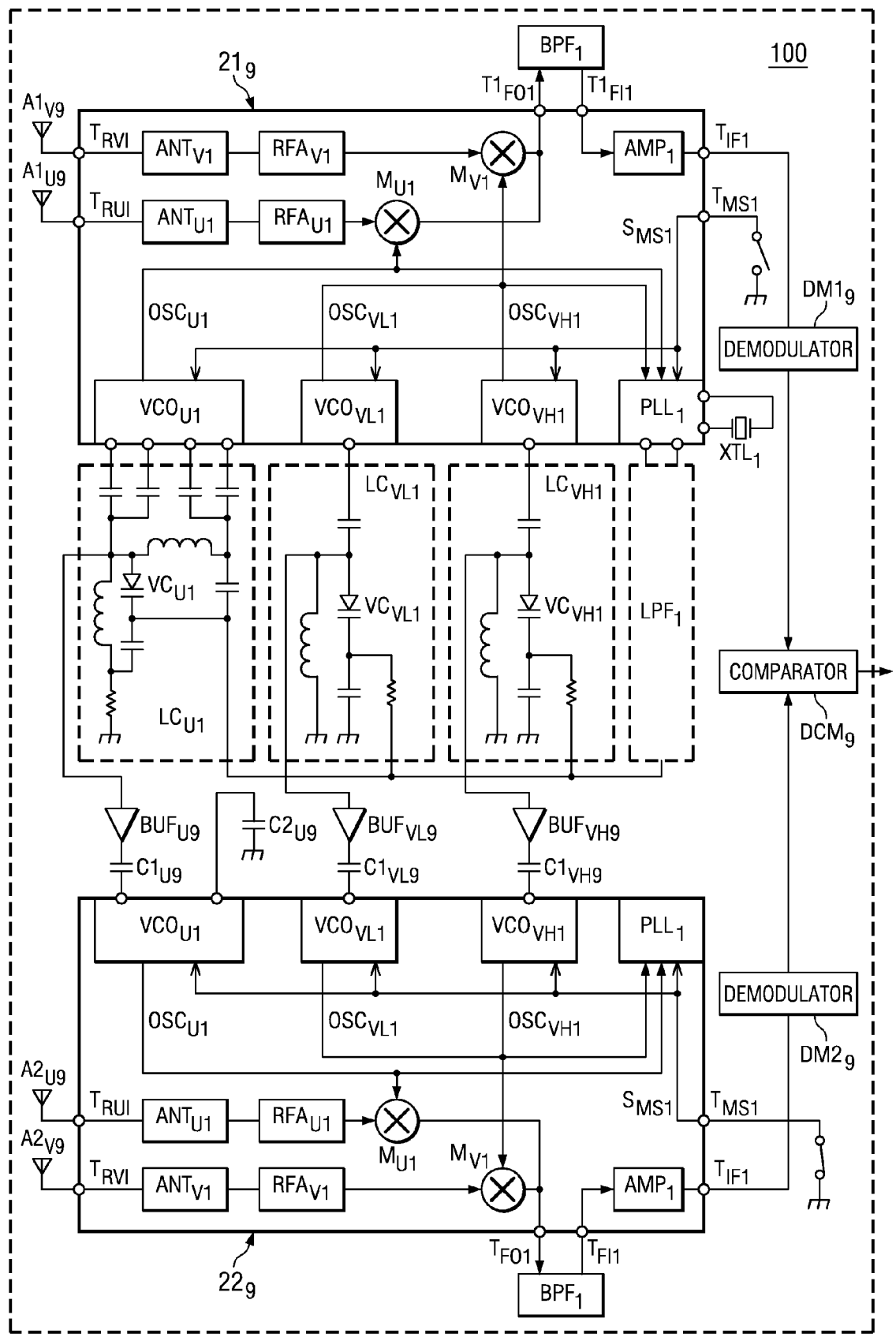
FIG. 9 shows an example of the diversity receiver using the IC shown in FIG. 1.

FIG. 9 shows the configuration of the diversity receiver disclosed in an embodiment of the present invention. As shown in FIG. 9, diversity receiver 100 comprises antennas A1U9 and A2U9 for UHF broadcasts, antennas A1V9 and A2V9 for VHF broadcasts, IC219 with master/slave selection terminal TMS1 open, bandpass filter BPF1, UHF band LC circuit LCU1 including variable-capacitance diode VCU1, VHF low-band LC circuit LCVL1 including variable-capacitance diode VCVL1, VHF high-band LC circuit LCVH1 including variable-capacitance diode VCVH1, low-pass filter LPF1 and crystal oscillator XTL1, IC229 with master/slave selection terminal TMS1 grounded, buffers BUFU9, BUFVL9, and BUFVH9 that connect the external oscillation signal from IC219 to IC229, capacitors C1U9-C1VH9, demodulators DM19 and DM29, and comparator DCM9 that selects one of the two demodulated signals.

Diversity receiver 100 with the configuration operates as follows when receiving UHF broadcast signals. Antennas A1U9 and A2U9 receive the same broadcast signal. IC219 converts the frequency of the UHF signal received from antenna A1U9. The UHF signal received by antenna A1U9 is input from received signal terminal TRU1 to IC219. After being tuned by antenna tuning circuit ANTU1 and amplified by radio-frequency amplifier circuit RFAU1 in IC219, the received signal is input to mixer MU1. Master/slave selection terminal TMS1 of IC219 is open. IC219 is set to master mode. Consequently, the UHF band VCO circuit VCOU1 of IC219 generates UHF band local oscillation signal OSCU1 along with UHF band LC circuit LCU1 outside the IC. VHF low-band VCO circuit VCOVL1 and VHF high-band VCO circuit VCOVH1 stop oscillating. UHF band mixer MU1 converts the frequency of the received UHF signal using the UHF band local oscillation signal OSCU1 to generate a UHF intermediate-frequency signal. The UHF intermediate-frequency signal is output from IC219 at differential-frequency filter output terminal TFO1 and is filtered by bandpass filter BPF1. The filtered UHF intermediate-frequency signal is reinput to IC219 from intermediate-frequency filter input terminal TFI1. After being amplified by intermediate-frequency amplifier circuit AMP1, the filtered VHF intermediate-frequency signal is output from the intermediate-frequency signal terminal TIF1 of IC219 and is input to demodulator DM19. The demodulated signal generated by demodulator DM19 is input to comparator DCM9.

On the other hand, IC229 converts the frequency of the UHF signal received from antenna A2U9. The UHF signal received by antenna A2U9 is input from received signal terminal TRU1 to IC229. After being tuned by antenna tuning circuit ANTU1 and amplified by radio-frequency amplifier circuit RFAU1 in IC229, the received signal is input to mixer MU1. Master/slave selection terminal TMS1 of IC229 is grounded. IC229 is set to slave mode. Consequently, for the VCO circuits VCOU1, VCOVL1 and VCOVH1 of IC229, the operation of the constant current circuit is stopped. Also, the supply of power to PLL circuit PLL1 is stopped. In this way, any unnecessary power consumption can be reduced. The UHF band local oscillation signal generated by IC219 and present in UHF band LC circuit LCU1 is input from buffer BUFU9 and capacitor C1U9 to the oscillation signal input terminal T1IU9 of IC229. In IC229, the UHF band local oscillation signal bypasses the first differential section DIF1U2 of UHF band VCO circuit VCOU1 and is input as local oscillation signal OSCU1 to UHF band mixer MU1 by the second differential section DIF2U2. UHF band mixer MU1 converts the frequency of the received UHF signal using the UHF band local oscillation signal generated by IC219 to generate a UHF intermediate-frequency signal. The UHF intermediate-frequency signal is output from IC229 at intermediate-frequency filter output terminal TFO1 and is filtered by bandpass filter BPF1. The filtered VHF intermediate-frequency signal is input to IC220 again from intermediate-frequency filter input terminal TFI1. After being amplified by intermediate-frequency amplifier circuit AMP1, the filtered UHF intermediate-frequency signal is output from the intermediate-frequency signal terminal TIF1 of IC229 and is input to demodulator DM29. The demodulated signal generated by demodulator DM29 is input to comparator DCM9.

Since the reception state varies as a function of the orientation of the antenna, the quality of the demodulated signal generated by demodulator DM19 from the received signal of antenna A1U9 and the demodulated signal generated by demodulator DM2U9 from the received signal of antenna A2U9 differ. Comparator DCM9 compares the two demodulated signals, selects the demodulated signal obtained from the received signal with the better reception state and outputs that signal from the receiver.

Embodiment 1

Figure 10:
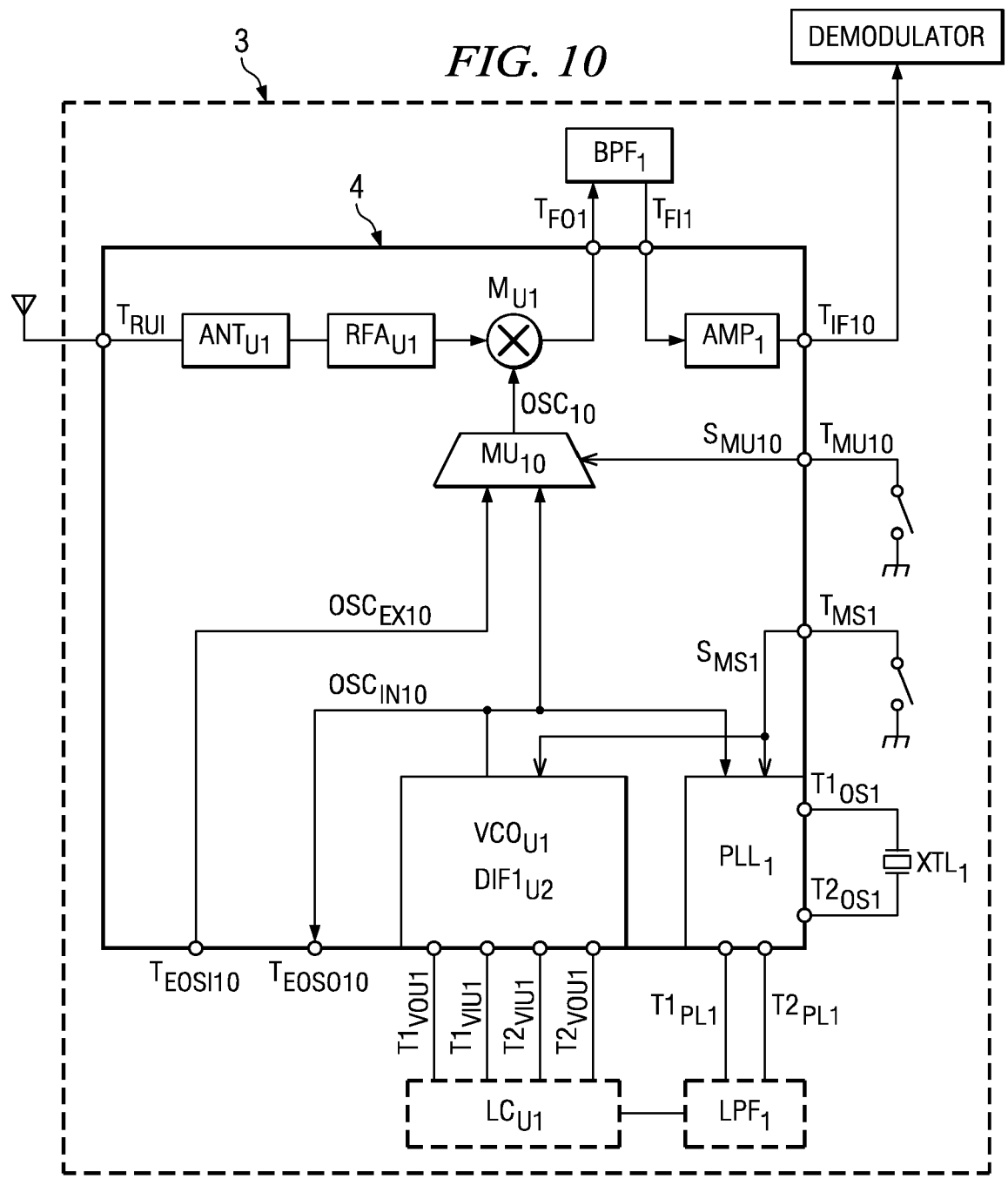
FIG. 10 is a diagram illustrating an example of another configuration of the IC and tuner disclosed in the present invention.

In the following, another embodiment of the present invention will be explained based on FIGS. 10-13. FIG. 10 shows the configuration of IC and tuner disclosed in this embodiment of the present invention. This IC and tuner receive UHF band broadcasts.

As shown in FIG. 10, IC4 disclosed in this embodiment of the present invention has UHF received signal terminal TRU1, UHF antenna tuning circuit ANTU1, UHF radio-frequency amplifier circuit RFAU1, intermediate-frequency filter output terminal TFO1 and intermediate-frequency filter input terminal TFI1, intermediate-frequency amplifier circuit AMP1, intermediate-frequency signal terminal TIF1, UHF band oscillation signal input terminals T1VIU1 and T2VIU1, UHF band oscillation signal output terminals T1VOU1 and T2VOU1, the differential section DIF1U2 of UHF band VCO circuit VCOU1, voltage control signal output terminals T1PL1 and T2PL1, reference oscillation signal terminals T1OS1 and T2OS1, PLL circuit PLL1, UHF band mixer MU1, master/slave selection terminal TMS1, multiplexer MU10, multiplexer control terminal TMU10, local oscillation signal output terminal TEOSO10, and local oscillation signal input terminal TEOSI10.

Also, as shown in FIG. 10, tuner 3 comprises IC4 bandpass filter BPF1, UHF band LC circuit LCU1, low-pass filter LPF1, and crystal oscillator XTL1. As shown in FIG. 10, UHF band oscillation signal input terminals T1VIU1 and T2VIU1 as well as UHF band oscillation signal output terminals T1VOU1 and T2VOU1 of IC4 are connected to UHF band LC circuit LCU1. Reference oscillation signal terminals T1OS1 and T2OS1 are connected to crystal oscillator XTL1.

Of the constituent elements of said IC4 and tuner 3, those represented by the same symbols as the constituent elements of said IC2 and tuner 1 in FIG. 1 operate in the same way as said IC2 and tuner 1. Therefore, the explanation of these elements is omitted.

The configurational differences between said IC4 and IC2 are (1) that 1 UHF band VCO circuit VCOU1 is constituted with only the first differential section DIF1U2, and (2) that multiplexer MU10, multiplexer control terminal TMU10, local oscillation signal output terminal TEOSO10, and local oscillation signal input terminal TEOSI10 have been added.

In the following, the operation of IC4 with the configuration will be explained focusing on the differences. The internal internal local oscillation signal OSCIN10 in the UHF band is generated by the first differential section DIF1U2 of UHF band VCO circuit VCOU1 and UHF band LC circuit LCU1. It is the previous signal buffered by the second differential section DIF2U2 of UHF band VCO circuit VCOU1 shown in FIG. 2. On the other hand, the external oscillation signal OSCEX10 in the UHF band is input from local oscillation signal input terminal TEOSI10 to IC4. Multiplexer MU10 receives internal internal local oscillation signal OSCIN10 in the UHF band and external local oscillation signal OSCEX10 in the UHF band, selects one signal according to the value of multiplexer control signal SMU10 input from multiplexer control terminal TMU10, and outputs it as UHF band local oscillation signal OSC10 to UHF band mixer MU1.

If multiplexer control terminal TMU10 is open, multiplexer MU10 selects internal local oscillation signal OSCIN10 in the UHF band as local oscillation signal OSC10. If multiplexer control terminal TMU10 is grounded, multiplexer MU10 selects external local oscillation signal OSCEX10 in the UHF band as UHF band local oscillation signal OSC10. Also, internal local oscillation signal OSCIN10 in the UHF band is output from IC4 at local oscillation signal output terminal TEOSO10.

Figure 11:
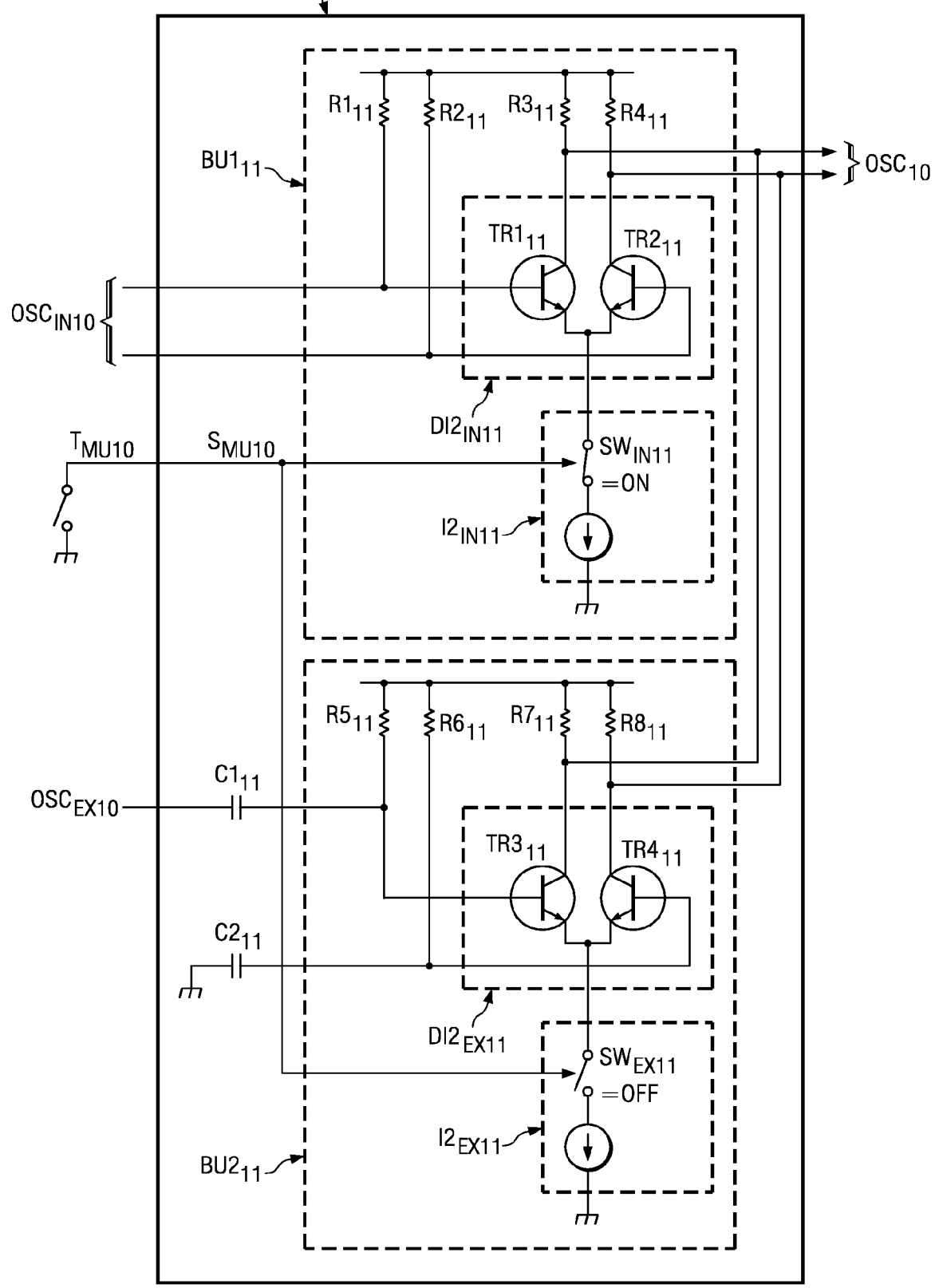
FIG. 11 shows an example of the configuration of the multiplexer in the IC shown in FIG. 10.

FIG. 11 shows the configuration of multiplexer MU10 shown in FIG. 10. As shown in FIG. 11, multiplexer MU10 comprises capacitors C111 and C211 as well as buffers BU111 and BU211 with their outputs connected. Local oscillation signal OSCIN1 in the UHF band is input to buffer circuit BU111. External local oscillation signal OSCEX10 in the UHF band is input as a differential input to buffer circuit BU211 via capacitors C111 and C211.

Buffer circuit BU111 comprises resistors R111-R411, differential input circuit DI2IN11 made up of two differentially connected transistors TR111 and TR211, and switch SWIN11-attached constant current circuit I2IN11. Switch SWIN11 is controlled by multiplexer control signal SMU10. If multiplexer control terminal TMU10 is open, switch SWIN11 operates constant current circuit I2IN11. Buffer circuit BU111 converts internal local oscillation signal OSCIN10 in the UHF band to a current mode signal and outputs it as UHF band local oscillation signal OSC10. If multiplexer control terminal TMU10 is grounded, switch SWIN11 stops the operation of constant current circuit I2IN11. Since the operation of constant current circuit I2IN11 is stopped, buffer circuit BU111 cannot output internal local oscillation signal OSCIN10 in the UHF band even if it is input.

Buffer circuit BU211 comprises resistors R511-R811, differential input circuit DI2EX11 comprising two differentially connected transistors TR311 and TR411, and switch SWEX11-attached constant current circuit I2EX11. Switch SWEX11 is controlled by multiplexer control signal SMU10. Unlike buffer circuit BU111, when multiplexer control terminal TMU10 is grounded, switch SWEX11 operates constant current circuit IEX11. Buffer circuit BU211 converts the external local oscillation signal OSCEX10 in the UHF band to a current mode signal and outputs it as UHF band oscillation signal OSC10. When multiplexer control terminal TMU10 is open, switch SWEX11 stops the operation of constant current circuit I2EX11. Since the operation of constant current circuit I2IN11 is stopped, buffer circuit BU211 cannot output external local oscillation signal OSCEX10 in the UHF band even if it is input.

As described above, according to multiplexer control signal SMU10, either buffer BU111 or buffer BU211 is in operation, while the other buffer stops operating. Consequently, multiplexer MU10 outputs internal local oscillation signal OSCIN10 in the UHF band or external local oscillation signal OSCEX10 in the UHF band as UHF band local oscillation signal OSC10.

Figure 12:
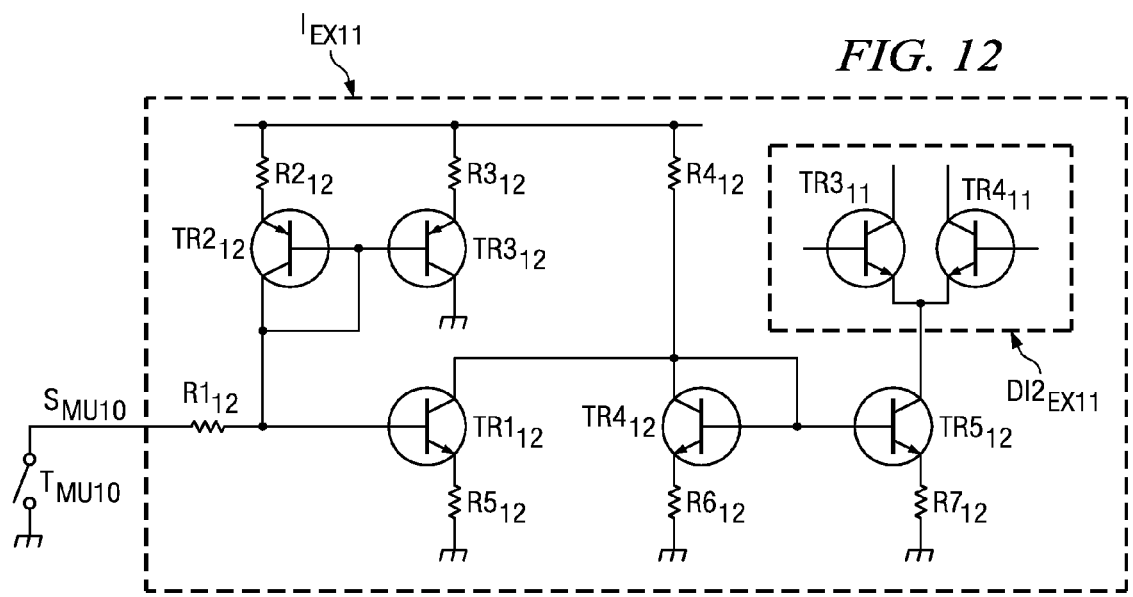
FIG. 12 shows an example of the configuration of the switch-attached constant current circuit in the multiplexer shown in FIG. 11.
Figure 14:
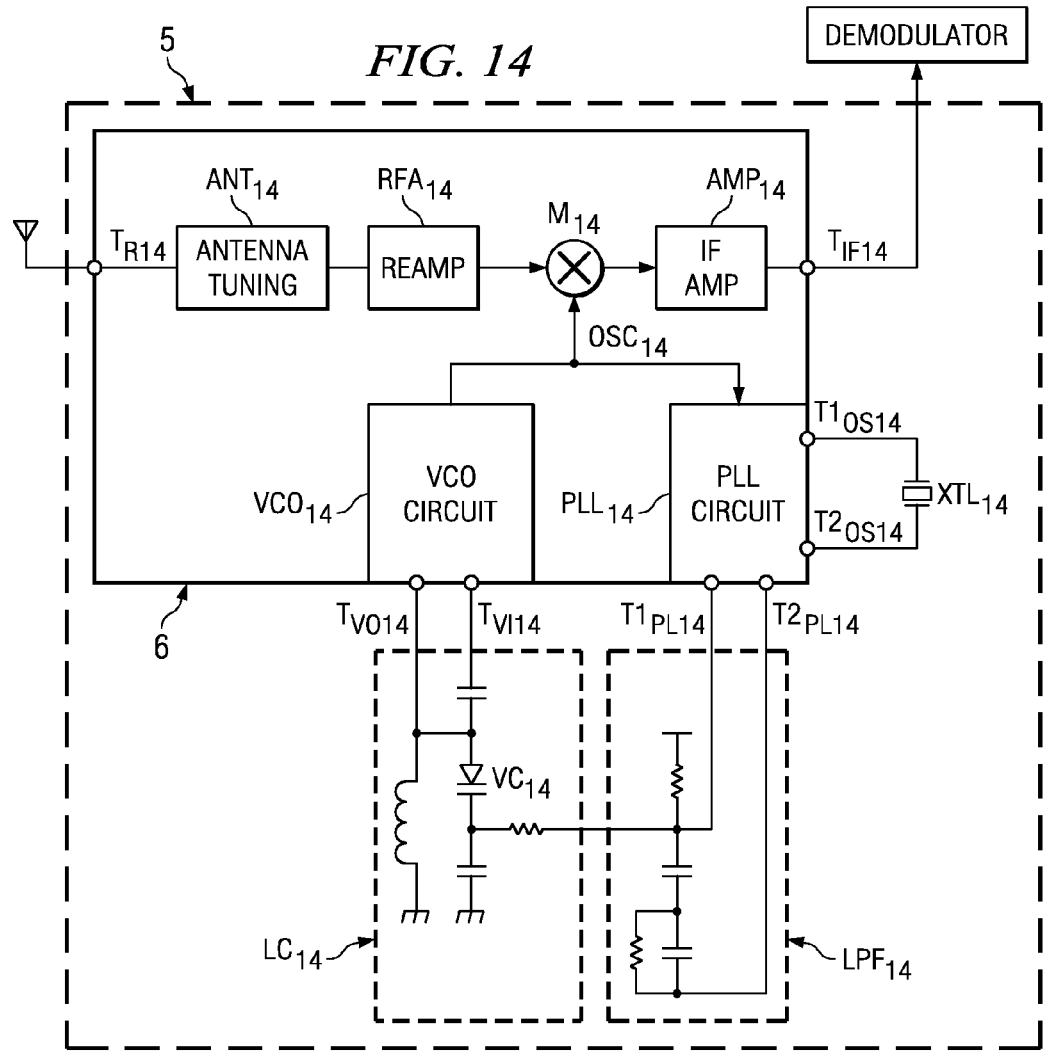
FIG. 14 shows the conventional IC and tuner.

FIG. 12 shows the configuration of switch SWEX11-attached constant current circuit I2EX11 of buffer circuit BU211 shown in FIG. 11. The switch SWIN11-attached constant current circuit I2IN11 of buffer circuit BU111 has the same configuration as switch SWU2-attached constant current circuit I1U2 shown in FIG. 4. Therefore, its explanation will be omitted. As shown in FIG. 12, switch SWEX11-attached constant current circuit I2EX11 comprises resistors R112-R712, transistor TR112 receiving the multiplexer control signal SMU10 of multiplexer control terminal TMU10, transistors TR212 and TR312 that constitute a current source, and transistors TR412 and TR512 that constitute a current-mirror constant current circuit connected to differential input circuit DI2EX11.

The switch SWEX11-attached constant current circuit I2EX11 with the configuration operates as follows. When multiplexer control terminal TMU10 is open, current from the collector of transistor TR212 of the current source flows into the base of the first transistor TR112. At that time, the current flowing from the current source via resistor R412 flows into the collector of the first transistor TR112 instead of the collector of the transistor TR412 of the current-mirror constant current circuit. As a result, the current-mirror constant current circuit cannot operate since it cannot receive input current.

When multiplexer control terminal TMU10 is grounded, current from the collector of transistor TR212 of the current source flows into the grounded multiplexer control terminal TMU10. At that time, no base or collector current flows in the first transistor TR112. The current flowing from the current source via resistor R412 flows into the collector of the transistor TR412 of the current-mirror constant current circuit. As a result, the current mirror constant circuit can operate since it receives input current.

Figure 13:
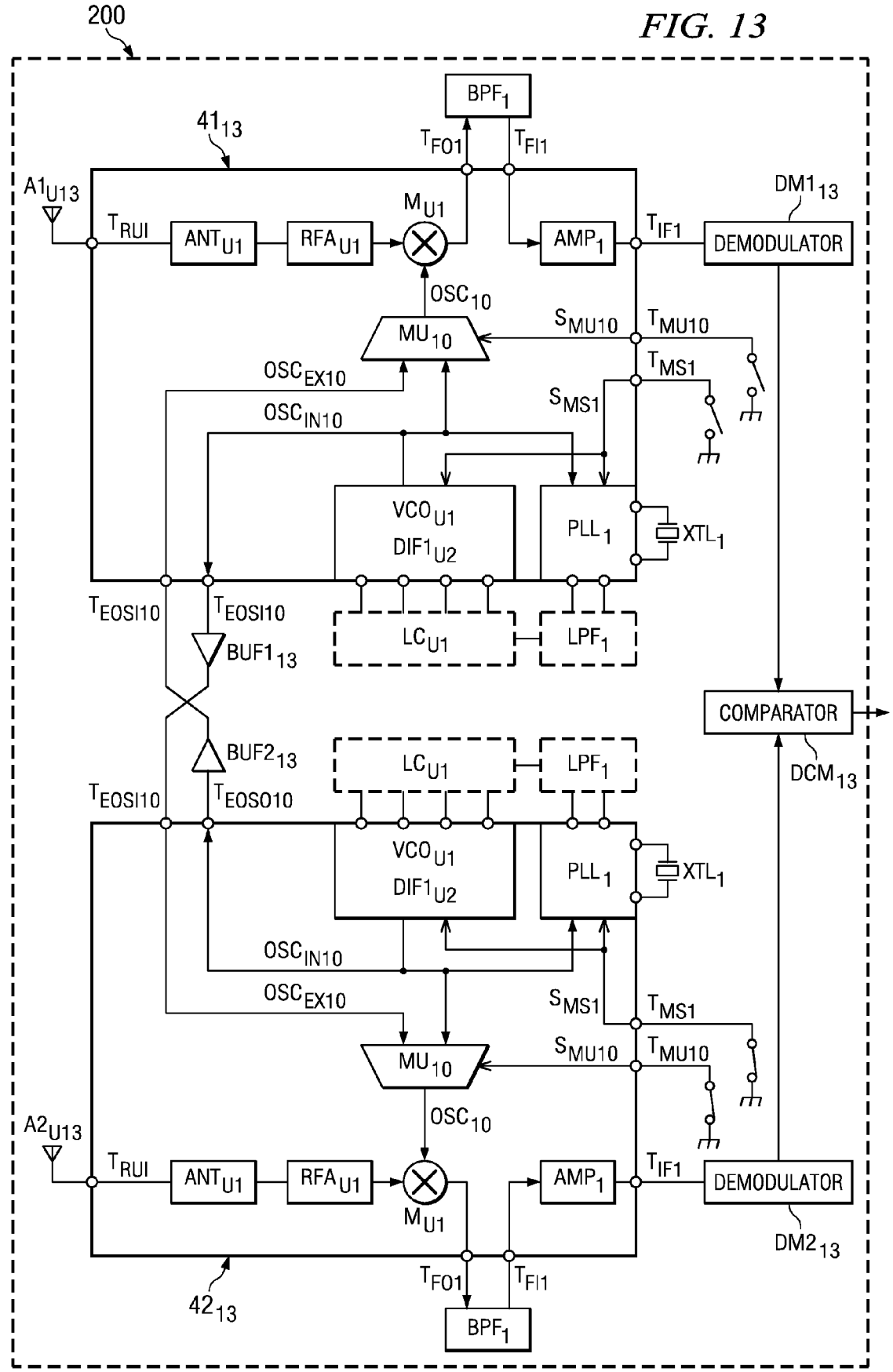
FIG. 13 shows an example of the diversity receiver using the IC shown in FIG. 10.
Figure 15:
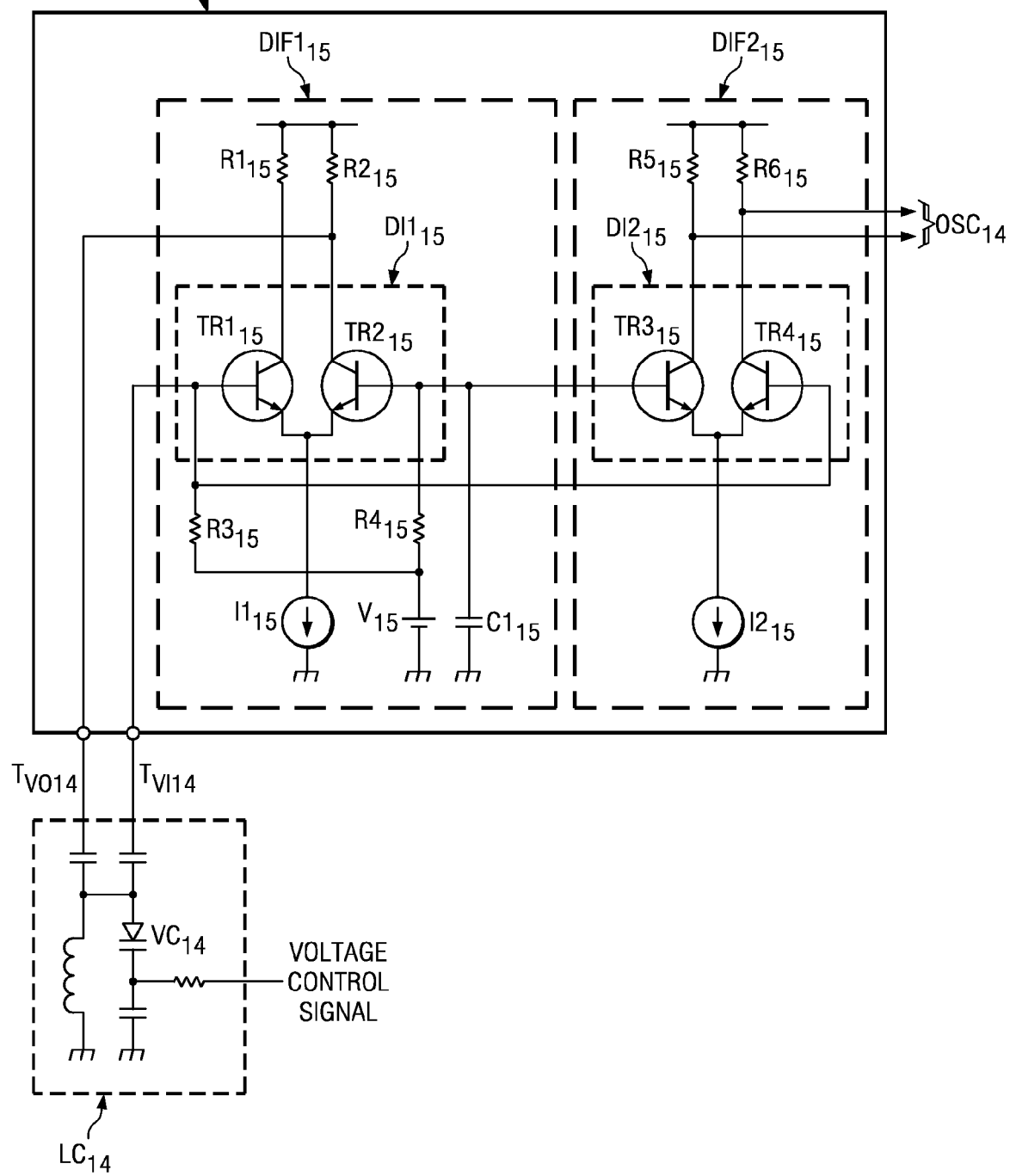
FIG. 15 shows the configuration of the conventional VCO circuit and the connection to the LC circuit.
Figure 16:
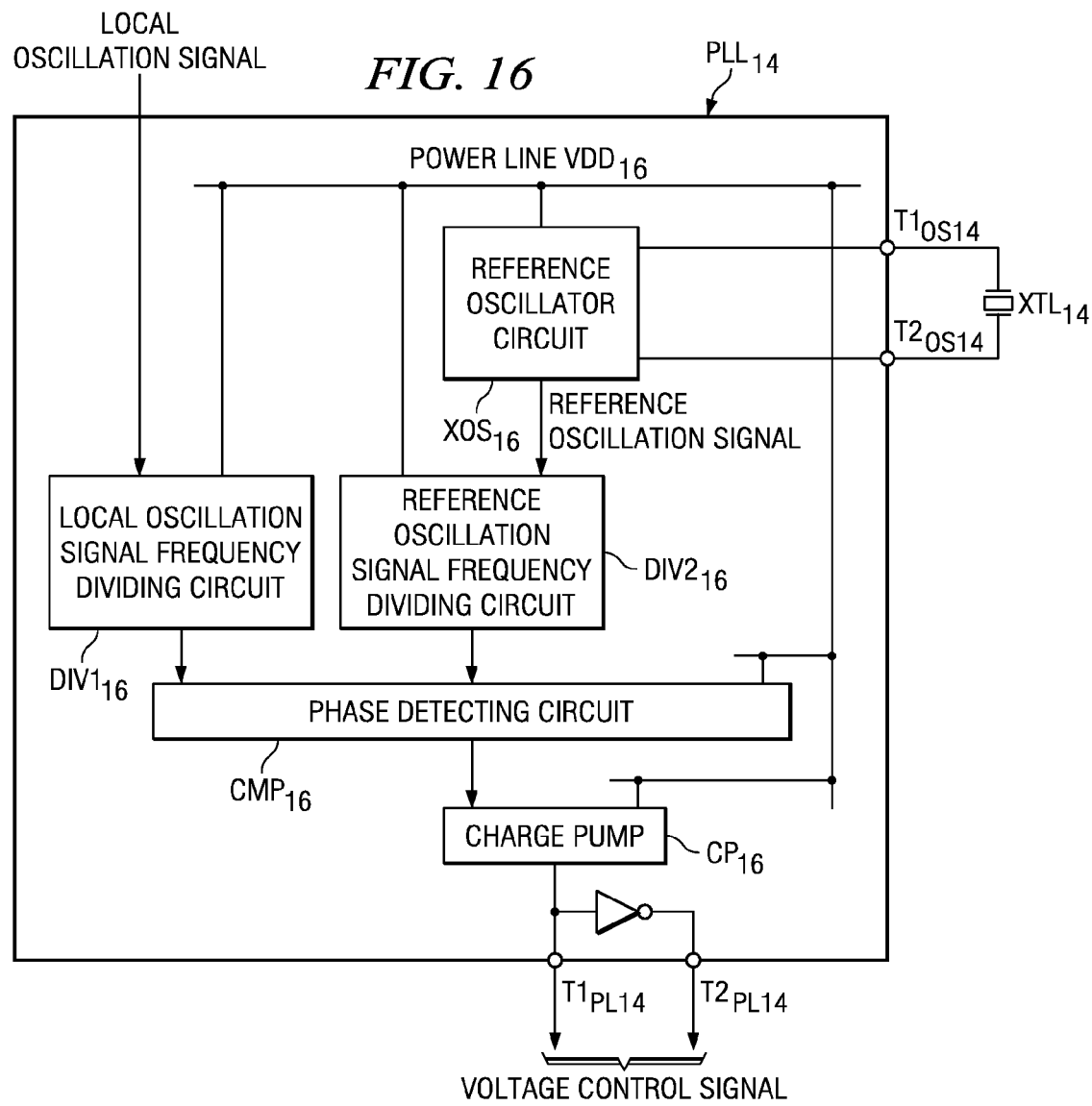
FIG. 16 shows the configuration of the conventional PLL circuit.
Figure 17:
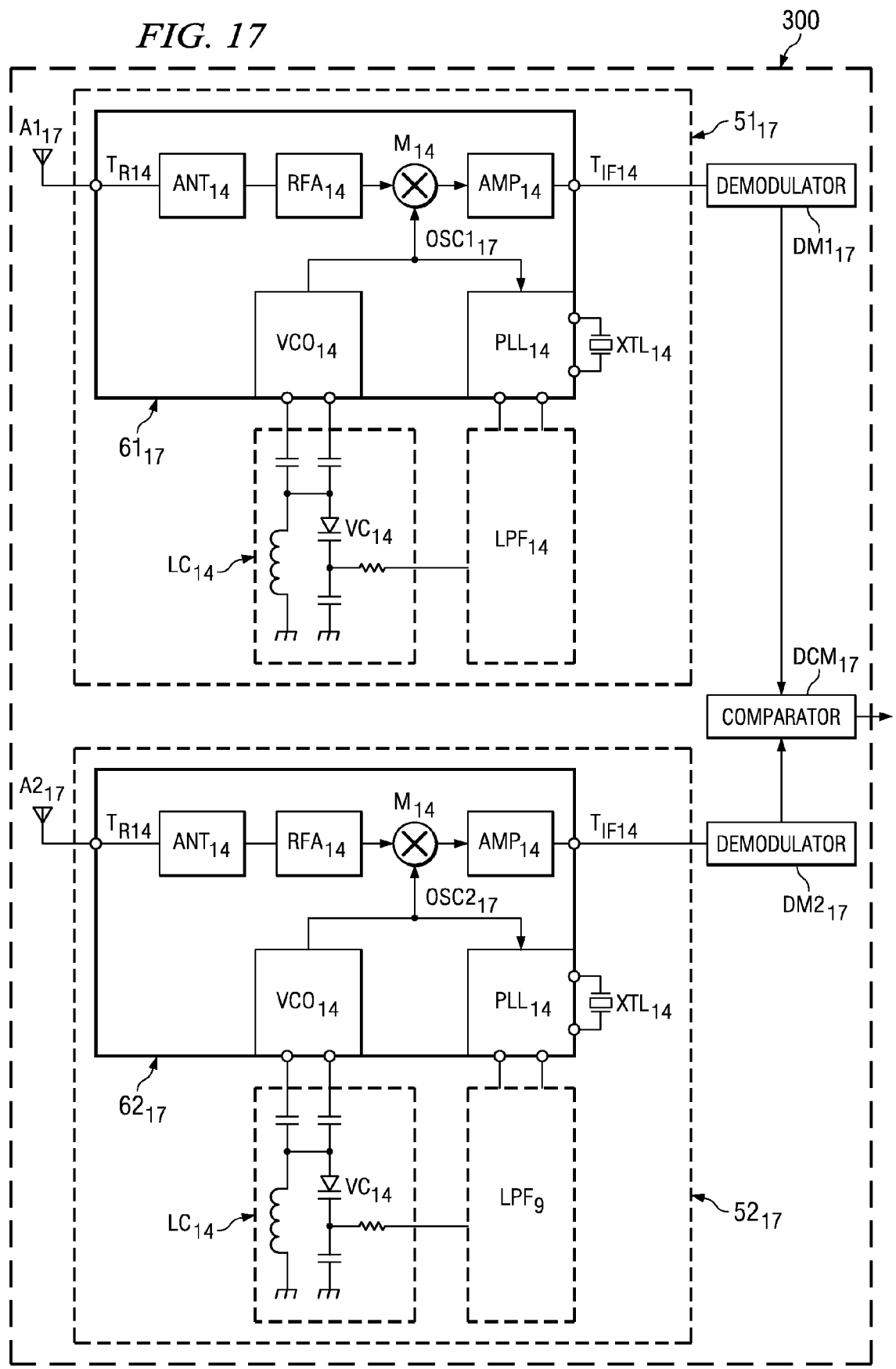
FIG. 17 shows a conventional diversity receiver constituted using two Ics.
Figure 18:
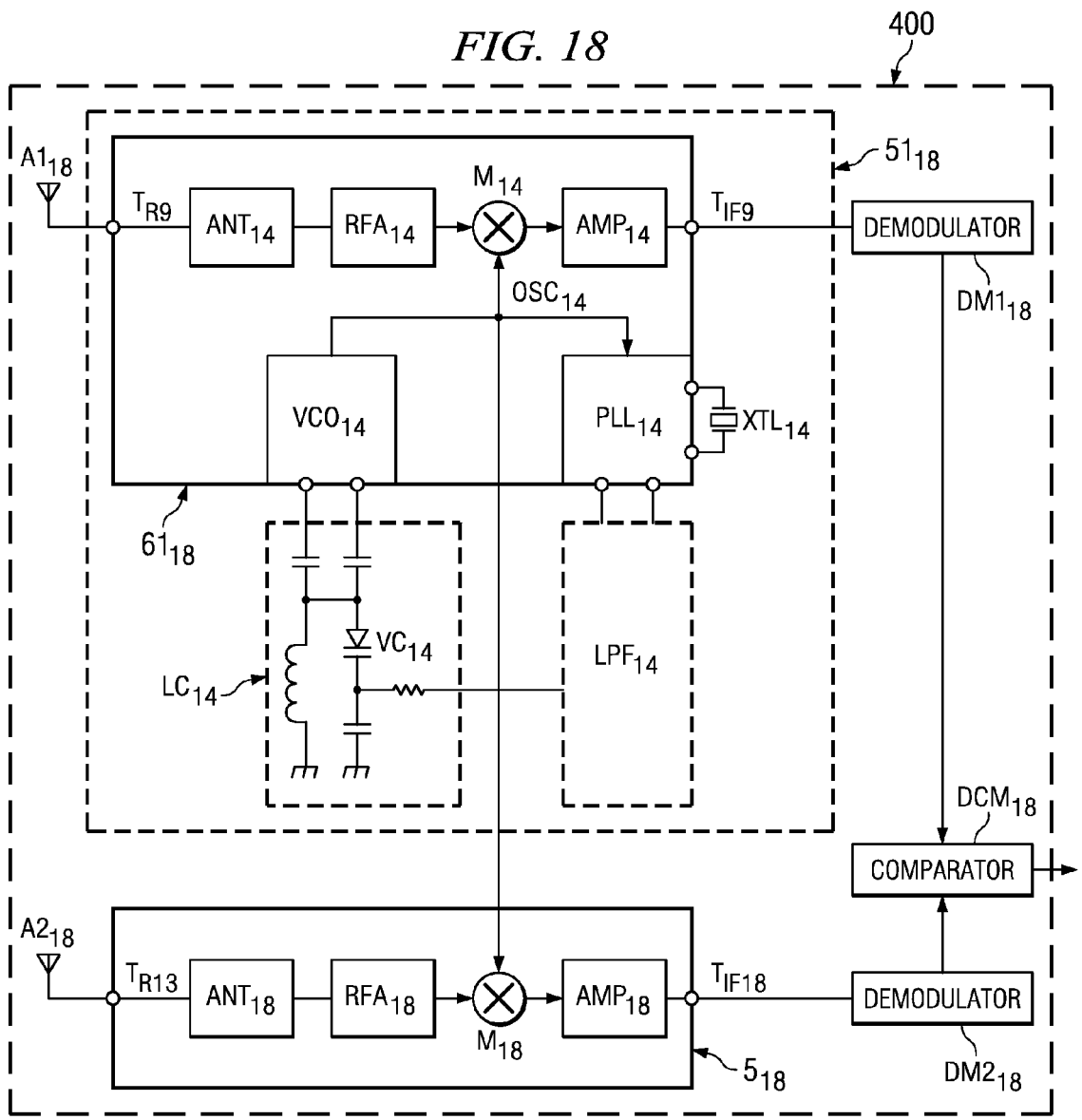
FIG. 18 shows a conventional diversity receiver constituted using two types of ICs.

FIG. 13 shows the configuration of the diversity receiver disclosed in another embodiment of the present invention using said IC4. As shown in FIG. 13, diversity receiver 200 comprises antennas A1U13 and A2U13 for UHF broadcast, IC4113 with master/slave selection terminal TMS1 and multiplexer control terminal TMU10 open, bandpass filter BPF1 and UHF band LC circuit LCU1 and low-pass filter LPF1 and crystal oscillator XTL1 used for IC4113, IC4213 with master/slave selection terminal TMS1 and multiplexer control terminal TMU10 grounded, bandpass filter BPF1 and UHF band LC circuit LCU1 and low-pass filter LPF1 and crystal oscillator XTL1 used for IC4213, buffer BUF113 that connects the local oscillation signal output terminal TEEOSO10 of IC4113 to the local oscillation signal input terminal TEOSI10 of IC4213, buffer BUF213 that connects the local oscillation signal output terminal TEOSO10 of IC4213 to the local oscillation signal input terminal TEOSI10 of IC4113, demodulators DM113 and DM213, and comparator DCM13 that selects one of the two demodulated signals.

Of the constituent elements of said diversity receiver 200, those represented by the same symbols as the constituent elements of diversity receiver 100 disclosed in another embodiment of the present invention shown in FIG. 9 operate in the same way as diversity receiver 100. Therefore, the explanation of these elements will be omitted.

The configurational differences between diversity receivers 200 and 100 include (1) the local oscillation signal is selected by setting multiplexer control terminal TMU10 of the IC, (2) when the local oscillation signal output terminal of one of the ICs is connected to the local oscillation signal input terminal of the other IC, the local oscillation signal can be supplied to the other IC, and (3) the two ICs can supply a local oscillation signal to each other by setting the multiplexer control terminal TMU10 and master/slave selection terminal TMS1.

In the following, the operation of said diversity receiver 200 will be explained focusing on the differences.

The multiplexer control terminal TMU10 of IC4113 is open, and IC4113 selects the internal local oscillation signal OSCIN10 in the UHF band as the UHF band local oscillation signal OSC10. Since master/slave selection terminal TMS1 is also open, IC4113 is set to master mode. The first differential section DIF1U2 of UHF band VCO circuit VCOU1 generates the internal local oscillation signal OSCIN10 in the UHF band, along with the UHF band LC circuit LCU1 outside the IC. The internal local oscillation signal OSCIN10 in the UHF band is output to local oscillation signal output terminal TEOSO10. Also, it is selected by multiplexer MU10 and is output as UHF band local oscillation signal OSC10 to UHF band mixer MU1.

The multiplexer control terminal TMU10 of IC4213 is grounded, and IC4113 selects the external local oscillation signal OSCEX10 in the UHF band as UHF band local oscillation signal OSC10. Since master/slave selection terminal TMS1 is also grounded, IC4213 is set to slave mode. The UHF band LC circuit LCU1 outside the IC is connected to IC4213. However, since the operation of the constant current circuit in the first differential section DIF1U2 of UHF VCO circuit VCOU1 is stopped, the first differential section DIF1U2 stops the oscillation of UHF band VCO circuit VCOU1. Also, the generation of the voltage control signal is stopped when the supply of power to the PLL circuit PLL1 is stopped. The UHF band local oscillation signal output from the local oscillation signal output terminal TEOSO10 of IC4113 is input as external local oscillation signal OSCEX10 in the UHF band to the local oscillation signal input terminal TEOSI10 of IC4213 via buffer FIF1113. In IC4213, external local oscillation signal OSCEX10 in the UHF band bypasses the first differential section DIF1U2 of UHF band VCO circuit VCOU1 and is input to multiplexer MU10. External local oscillation signal OSCEX10 in the UHF band is selected as UHF band local oscillation signal OSC10 by multiplexer MU10 and is output to UHF band mixer MU1. UHF band VCO circuit VCOU1 of IC4213 set to slave mode stops the operation of the constant current circuit. Also, the supply of power to PLL circuit PLL1 is stopped. In this way, any unnecessary power consumption can be reduced.

If the multiplexer control terminal TMU10 and master/slave selection terminal TMS1 of IC4113 are grounded and the multiplexer control terminal TMU10 and master/slave selection terminal TMS1 of IC4213 are open, IC4213 is set to master mode to generate the UHF band local oscillation signal. IC4113 is set to slave mode. The UHF band local oscillation signal is received from IC4213 via buffer BUF213.

While the invention has been particularly shown and described with reference in preferred embodiments thereof it is well understood by those skilled in the art that various changes and modifications can be made in the invention without departing from the spirit and scope of the invention as defined by the appended claims.

The invention claimed is:

1. A semiconductor device for a tuner comprising
    (a) a mixer that converts the frequency of the received signal using a local oscillation signal;
    (b) a means that generates the local oscillation signal in the semiconductor device for a tuner;
    (c) a means that introduces the local oscillation signal from outside of the semiconductor device for a tuner; and
    (d) a power control means that reduces the power consumption of the semiconductor device for a tuner when the local oscillation signal is introduced from outside of the semiconductor device for a tuner, wherein at least one of the semiconductor devices for a first tuner generates the local oscillation signal inside the semiconductor device for the first tuner; and
another semiconductor device for a second tuner introduces the local oscillation signal from outside of the semiconductor device for the second tuner.

2. A semiconductor device for a tuner comprising:
    (a) a voltage-controlled oscillator circuit that generates a first local oscillation signal;
    (b) a phase-locked loop circuit that generates a voltage control signal for controlling the oscillation of the voltage-controlled oscillator circuit;
    (c) a power control means that controls the power consumption of at least one of voltage-controlled oscillator circuit or the phase-locked loop circuit or both
    (d) a local oscillation signal input terminal to which a second local oscillation signal is input;
    (e) a local oscillation signal selecting means that selects the first or second local oscillation signal as the local oscillation signal; and
    (f) a mixer that converts the frequency of the received signal using the local oscillation signal, wherein the local oscillation signal selecting means comprises
    (g) at least one semiconductor device for a first tuner that selects a first oscillation signal as the local oscillation signal;
    (h) at least one semiconductor device for a second tuner that selects a second oscillation signal as the local oscillation signal, and wherein the local oscillation signal input terminal of the semiconductor device for the second tuner being driven by the local oscillation signal of said first semiconductor device for the first tuner.

3. The semiconductor device for a tuner described in claim 2 comprising:
    (a) a selection signal input terminal;
    (b) a power control signal input terminal, wherein
    (c) the local oscillation signal selecting means selects the first or second local oscillation signal as the local oscillation signal as a function of the state of the selection signal input from the selection signal input terminal; and
    (d) the power control means controls the power consumption of the voltage-controlled oscillator circuit and/or the phase-locked loop circuit as a function of the state of the power control signal input from the power control signal input terminal.

4. The semiconductor device for a tuner described in claim 3 wherein the voltage-controlled oscillator circuit comprises a differential input circuit, which includes two differentially connected transistors and a constant current circuit.

5. The semiconductor device for a tuner described in claim 2 comprising:
(a) a selection signal input terminal, wherein
(b) the local oscillation signal selecting means selects the first or second local oscillation signal as the local oscillation signal as a function of the state of the selection signal input from the selection signal input terminal; and
(c) the power control means controls the power consumption of the voltage-controlled oscillator circuit and/or the phase-locked loop circuit as a function of the state of the selection signal.

6. The semiconductor device for a tuner described in claim 5 wherein the voltage-controlled oscillator circuit comprises a differential input circuit, which includes two differentially connected transistors and a constant current circuit.

7. The semiconductor device for a tuner described in claim 2 wherein the voltage-controlled oscillator circuit comprises a differential input circuit, which includes two differentially connected transistors and a constant current circuit.

8. The semiconductor device for a tuner described in claim 7 wherein the power control means includes a circuit that controls the operation and stopping of the constant current circuit in the voltage-controlled oscillator circuit.

9. The semiconductor device for a tuner described of claim 2 wherein the phase-locked loop circuit comprises a first frequency dividing circuit that divides the frequency of the first local oscillation signal, a reference oscillator circuit that generates a reference oscillation signal, a second frequency dividing circuit that divides the frequency of the reference oscillator circuit, a phase detecting circuit that compares the phases of the output signals of the first and second frequency dividing signals, and a charge pump circuit that generates the voltage control signal for the voltage-controlled oscillator circuit from the output signal of the phase detecting circuit.

10. The semiconductor device for a tuner described in claim 9 wherein the power control means comprises a power line, which is connected to the first frequency dividing circuit of the phase-locked loop circuit and the reference oscillator circuit as well as the second frequency dividing circuit, the phase detecting circuit and the charge pump circuit, and a circuit that controls the operation and stopping of power supply to the power line.

11. The semiconductor device for a tuner described in claim 2 comprising a local oscillation signal output terminal that outputs the first local oscillation signal.

12. A diversity receiving device comprising a plurality of semiconductor devices according to claim 11, wherein the local oscillation signal input terminal of each of the first and second semiconductor devices for a tuner is connected to the local oscillation output terminal of another semiconductor device for another tuner.

13. A semiconductor device for a tuner comprising;
(a) a selection signal terminal to which a selection signal is input;
(b) an oscillation signal terminal to which an oscillation signal is input;
(c) a voltage-controlled oscillator circuit that oscillates as a function of the oscillation signal to generate a local oscillation signal when the selection signal is in a first state and stops oscillating and bypasses the oscillation signal as the local oscillation signal when the selection signal is in a second state;
(d) a phase-locked loop circuit that generates a voltage control signal for controlling the oscillation of the voltage-controlled oscillator circuit when the selection signal is in the first state and stops the generation of the voltage control signals when the selection signal is in the second state;
(e) a power control means that controls the power consumption of one of the voltage-controlled oscillator circuit and the phase-locked loop circuit as a function of the state of the selection signal; and
(f) a mixer that converts the frequency of the received signal using the local oscillation signal output from the voltage-controlled oscillator circuit
(g) at least one semiconductor device for a first tuner that selects the first state, comprising
(h) at least one semiconductor device for a second tuner that selects the second state; wherein the oscillation signal terminal of the semiconductor device for the second tuner is driven by the local oscillation signal of said semiconductor device for the first tuner.

14. The semiconductor device for tuner described in claim 13 wherein the voltage-controlled oscillator circuit comprises a differential input circuit, which includes two differentially connected transistors and a constant current circuit.

15. The semiconductor device for a tuner described in claim 14 wherein the power control means includes a circuit that controls the operation and stopping of the constant current circuit in the voltage-controlled oscillator circuit.

16. The semiconductor device for a tuner described in claim 13 wherein the phase-locked loop circuit comprises a first frequency dividing circuit that divides the frequency of the first local oscillation signal, a reference oscillator circuit that generates a reference oscillation signal, a second frequency dividing circuit that divides the frequency of the reference oscillator circuit, a phase detecting circuit that compares the phase of the output signals of the first and second frequency dividing signals, and a charge pump circuit that generates the voltage control signal for the voltage-controlled oscillator circuit from the output signal of the phase detecting circuit.

17. The semiconductor device for a tuner described in claim 16 wherein the power control means includes a power line, which is connected to the first frequency dividing circuit of the phase-locked loop circuit and the reference oscillator circuit as well as the second frequency dividing circuit, the phase detecting circuit and the charge pump circuit, and a circuit that controls the operation and stopping of the power supply to the power line.

* * * * *